United States Patent
Gupte et al.

[11] Patent Number: 5,812,416
[45] Date of Patent: Sep. 22, 1998

[54] INTEGRATED CIRCUIT DESIGN DECOMPOSITION

[75] Inventors: Vilas V. Gupte, Fremont; Sanjay Adkar, Saratoga, both of Calif.

[73] Assignee: LSI Logic Corporation, Milpitas, Calif.

[21] Appl. No.: 683,287

[22] Filed: Jul. 18, 1996

[51] Int. Cl.[6] .................................................. G06F 17/50
[52] U.S. Cl. ........................... 364/490; 364/489; 364/488
[58] Field of Search ................................... 364/488, 489, 364/490, 491, 578

[56] References Cited

U.S. PATENT DOCUMENTS

| | | | |
|---|---|---|---|
| 4,882,690 | 11/1989 | Shinsha et al. | 364/490 |
| 4,922,432 | 5/1990 | Kobayashi et al. | 364/490 |
| 5,175,696 | 12/1992 | Hooper et al. | 364/489 |
| 5,212,650 | 5/1993 | Hooper et al. | 364/489 |
| 5,359,537 | 10/1994 | Saucier et al. | 364/489 |
| 5,436,849 | 7/1995 | Drumm | 364/490 |
| 5,473,547 | 12/1995 | Muroga | 364/489 |
| 5,502,661 | 3/1996 | Glunz | 364/578 |
| 5,544,067 | 8/1996 | Rostoker et al. | 364/489 |
| 5,572,437 | 11/1996 | Rostoker et al. | 364/489 |
| 5,623,418 | 4/1997 | Rostoker et al. | 364/489 |

*Primary Examiner*—Vincent N. Trans
*Attorney, Agent, or Firm*—Townsend and Townsend and Crew LLP

[57] ABSTRACT

Methods and systems of automatically generating synthesis scripts and hierarchical flow/connectivity diagrams are provided. The user inputs design constraints, clock characteristics, technology files, and HDL code. The system handles cores, megafunctions, hardmacs, and black boxes appropriately for synthesis. During synthesis, individual modules in the HDL code may change. The system manages these incremental changes by generating incremental scripts which 1) compile, map and model the modules that have been changed and 2) characterize, compile and model the modules that have been changed in the hierarchy under that instance. During the iterative design process, new hierarchical flow diagrams may be generated to understand the full effect of the incremental changes.

11 Claims, 20 Drawing Sheets

INTEGRATED CIRCUIT DESIGN DECOMPOSITION

BACKGROUND OF THE INVENTION

The present invention is related to improved computer-aided methods for creating integrated circuits and, more particularly, to computer-aided methods for design, verification, implementation, and signoff of Application-Specific Integrated Circuits (ASICs).

A customer typically approaches a foundry to make an ASIC according to the customer's specifications. The customer's specifications may include input/output (I/O), timing diagrams, state machines, power and thermal requirements, clocking, floorplan area, and Hardware Description Language (HDL) source code. HDL is a programming language that is used to model digital systems at many levels of abstraction ranging from the algorithmic level to the gate level. The complexity of the digital system may vary from that of a simple gate to a complete digital electronic system, or anything in between.

The production of an ASIC is generally performed in two phases: a design phase and an implementation phase. In the design phase, design engineers at the foundry work with the customer to develop the behavioral specifications for the ASIC. Depending on the information provided by the customer, the design engineers may have a very active role in the development of the behavioral specifications. Once the design phase is completed, the design engineers pass the behavioral specifications and other information to implementation engineers at the foundry. The process of passing control from the design phase to the implementation phase is called the design signoff ("signoff"). During the implementation phase, the implementation engineers produce a gate level specification of the ASIC and perform other functions (e.g., layout) required to produce the ASIC.

Throughout the design and implementation phases, HDL has many uses including behavioral specification, gate level specification, and implementation of test benches. There are many different flavors of HDL for modeling digital systems. VHSIC HDL ("VHDL") was developed for the Department of Defense and has subsequently been standardized by the IEEE and ANSI. Verilog HDL is another flavor of HDL that is used in one embodiment of the invention. Although there are different variations of HDL, each has the capability of modeling digital systems at both the behavioral and structural (e.g., gate) level. HDL may also be used to implement a test bench which is a model that is used to simulate and verify the correctness of an HDL hardware model. HDL provides the capability of writing test benches in the same language that describes the hardware.

The present scale of integration (VLSI and ULSI) allows for entire systems to reside on a single chip. However, the design tools and methods that allow for newer levels of integration on a mass scale have traditionally lagged behind the ASIC technology. Currently, there is a need for new tools and methods that improve design, implementation and signoff for larger-scale levels of integration. The present invention fulfills this and other needs.

SUMMARY OF THE INVENTION

The present invention provides computer-aided systems and methods for design, verification, implementation, and signoff of ASICs. The present invention allows ASICs to be designed and produced in a very efficient manner.

As the name implies, an ASIC or Application Specific Integrated Circuit is designed for a specific application. Typically, the customer desires an ASIC to perform specific functions within an overall system. However, the overall system may not be available at the foundry during design and/or implementation phases. For example, the customer's system may reside at the customer's location it may be impractical to relocate the system to the foundry.

The present invention provides methods of verifying the design of the ASIC during design and implementation phases. The ASIC design is verified utilizing information from a system simulation in the customer's system environment. During system simulation, the invention captures "golden" vectors that may be used to test the ASIC during stand-alone simulation. The outputs generated by the ASIC during stand-alone simulation are compared to the outputs generated during the system simulation (i.e., the golden vectors). Thus, the customer's system simulation is reproduced without having to reproduce the customer's system environment which allows the operation of the ASIC to be verified during various states of synthesis. Additionally, the test bench for testing the ASIC in stand-alone simulation is automatically generated eliminating the need for the user to manually generate a test bench.

In one embodiment, a computer implemented method of testing integrated circuits that are a part of a system, comprises the steps of: receiving input and output specifications of an integrated circuit; generating a programming language capture module that captures inputs to and outputs from the integrated circuit during system simulation; and generating a programming language test bench module that simulates operation of the integrated circuit within the system without requiring the system, the test bench module taking as input the inputs to the integrated circuit during system simulation.

HDL is a very robust programming language that allows an integrated circuit to be modeled at a variety of abstraction levels. Typically, an HDL compiler performs syntax checks on the HDL code before or during compilation. Although syntax checks will identify certain errors, the resulting HDL code may not provide an efficient design flow that allows a quick turn-around time and efficient use of the silicon. For example, the HDL code may specify a gated clock in a way that does not produce a syntax error. However, the use of gated clocks should be avoided as they significantly complicate timing analysis, the construction of a properly balanced clock tree at the gate level, and the testing of the ASIC.

The present invention provides rule-based methods of ensuring correct-by-construction designs. Rules and guidelines are formulated which specify conditions that, although the syntax is correct, may result in unintended results, be inefficient, are hard to implement, or otherwise be undesirable. After the syntax of the HDL code is verified, the code is analyzed with respect to the rules and guidelines. Rules specify conditions that should be remedied and guidelines specify conditions that warrant closer examination. In a preferred embodiment, the rules and guidelines include categories such as HDL design/coding, scan design, and foundry specific implementation.

In one embodiment, a computer implemented method of checking programming language descriptions of integrated circuits, comprises the steps of: receiving a set of rules specifying undesirable syntactically correct code statements; retrieving a code statement in a programming language description of an integrated circuit; determining if the code statement violates one of the set of rules; and identifying the code statement to as user if the code statement violates one of the set of rules.

Synthesis scripts direct the synthesis tool in creating gate level specifications of integrated circuits. Generating synthesis scripts by hand and debugging the scripts are very complex tasks. The complexity is further increased because the entire design may not be completed at the same time. Therefore, it is helpful to have scripts that are able to account for incremental changes in the design process.

The present invention also provides methods of automatically generating synthesis scripts and hierarchical flow/connectivity diagrams. The user inputs design constraints, clock characteristics, technology files, and HDL code. The system handles cores, megafunctions, hardmacs, and black boxes appropriately for synthesis. During synthesis, individual modules in the HDL code may change. The system manages these incremental changes by generating incremental scripts which 1) compile, map and model the modules that have been changed and 2) characterize, compile and model the modules that have been changed in the hierarchy under that instance. During the iterative design process, new hierarchical flow diagrams may be generated to understand the full effect of the incremental changes.

In one embodiment, a computer implemented method of automatically generating at least one synthesis script for an integrated circuit, comprises the steps of: receiving as input user-specified characteristics and a programming language description of the integrated circuit; generating the at least one synthesis script for the integrated circuit that specifies the following steps: (i) synthesizing lower level modules according to default constraints; (ii) synthesizing a top level module according to user-specified constraints; and (iii) characterizing the lower level modules according to the user-specified constraints; and generating a gate level specification of the integrated circuit with the at least one synthesis script as input.

There are many different design tools or applications available for designing ASICs. However, as the applications perform different tasks, they may each require different design information and a different format of the data. In addition to this wasting storage space with copies of the same design information in different files and formats, it increases the complexity of changing the design information specified by the customer. Any changes should be propagated throughout the different files and formats.

The present invention provides a method of storing design information for an ASIC so that it may be utilized by design applications. The design information of the ASIC is stored in a database with security controls so that only certain users may change the design information (or other information in the database). When a user requests to utilize a design application, a design configuration manager retrieves the design information from the database that is needed and formats the data into a format suitable for the application. The design information is then stored in a temporary file that is discarded after the application has run, thus ensuring that the application runs with current information.

In one embodiment, a computer implemented method of running applications relating to design of an integrated circuit, comprises the steps of: storing design information of the integrated circuit in a database; receiving a user request to utilize an application for designing the integrated circuit; retrieving the information concerning the integrated circuit from the database required as input for the requested application; and formatting the retrieved information for the requested application.

Other features and advantages of the present invention will become apparent upon a perusal of the remaining portions of the specification and drawings.

DETAILED DESCRIPTION OF PREFERRED EMBODIMENTS

Table of Contents

Figure 1:
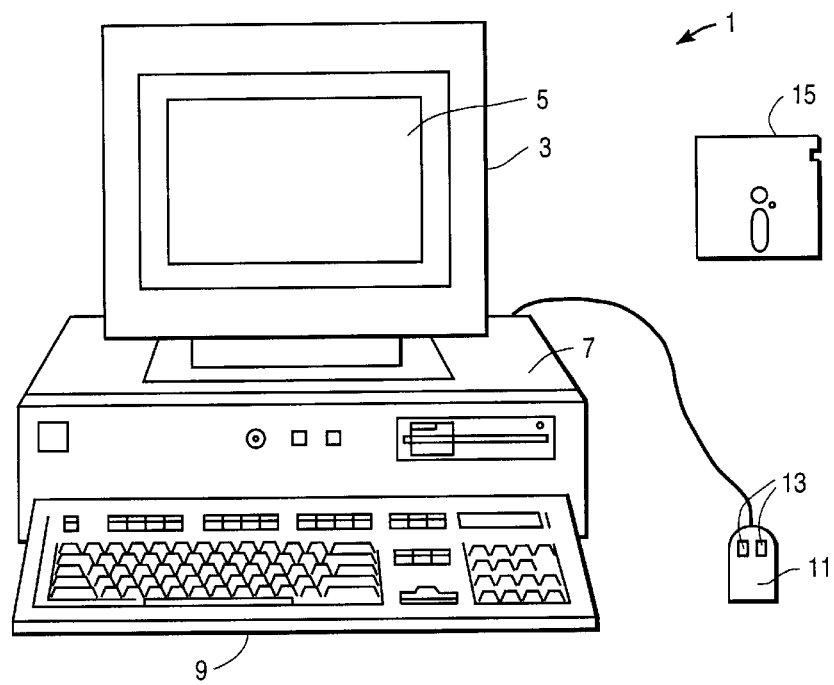
FIG. 1 illustrates an example of a computer system used to execute the software of the present invention.

I. Introduction
II. Vector Capture
III. HDL Expert System
IV. Design Decomposition
V. Design Configuration Introduction Synthesizable Behavioral HDL (SBHDL) will be used to describe HDL code that is targeted specifically to the foundry's HDL coding rules, memory and core building blocks, and realizable timing constraints for the anticipated process technology and packaging. During the design phase, arbitrary HDL code is transformed into SBHDL code.

A key concept in the SBHDL methodology of the present invention is the distinction between design and implementation. Design is the process of converting a concept and an architecture for an ASIC into a rigorous requirements specification for functionality, timing, power, I/O, and packaging. Implementation is the process of converting the ASIC requirements into a physical design specification that is suitable for fabrication. The distinction between these two phases in previous ASIC design flows had become blurred. In the SBHDL design flow, certain attributes of the ASIC are determined during design while others are decided only during implementation. Moreover, the design engineers are typically different people than the implementation engineers. This bifurcation dictates a clear hand-off of the design requirements and a clear identification attributes of the ASIC are determined in each phase. Design phase attributes may be the following:

- transfer functionality (ASIC inputs to outputs functional specification)
- state machine design
- datapath design
- I/O selection (including buffer types and drive strengths, pin-outs and power supplies)
- Spice I/O analysis
- ASIC packaging and power supply selection (e.g., 5 V or 3.3 V)
- clock domains and related HDL floorplan
- HDL module re-mapping to foundry modules (megafunctions/memories/cores) and module compilers
- cycle time and I/O pin to pin delay requirements
- power and thermal targets Implementation phase attributes may be the following:

- gate-level synthesis (the mapping of an HDL description to gates)
- module compilation (such as running MEMCOMP)
- JTAG insertion
- physical floorplan
- physical clocking scheme
- placement, routing and signal buffering
- testing methodology, test logic and test pattern generation In practice, the design and implementation phases will overlap up to the point of SBHDL-level signoff. By working in parallel and passing pertinent information back and forth, the design engineers and the implementation engineers are able to compress the design cycle time and identify and resolve critical issues earlier in the design process. The information which is passed between the engineers in each phase is highly structured, not ad-hoc.

In the description that follows, the present invention will be described in reference to a Sun Microsystems' computer system (workstation) in a UNIX environment. The present invention, however, is not limited to any particular environment or any particular application. Instead, those skilled in the art will find that the systems and methods of the present invention may be advantageously applied to a variety of systems, including different platforms of computers and operating systems. Therefore, the description of the embodiments that follow is for purposes of illustration and not limitation.

FIG. 1 illustrates an example of a computer system used to execute the software of the present invention. FIG. 1 shows a computer system 1 which includes a monitor 3, screen 5, cabinet 7, keyboard 9, and mouse 11. Mouse 11 may have one or more buttons such as mouse buttons 13. Cabinet 7 houses a floppy disk drive 14 which may be utilized to store and retrieve computer programs including code that incorporates the present invention, data files for use with the present invention, and the like. Although a floppy disk 15 is shown as a computer readable medium, other computer readable media including CD-ROM, tape, DRAM, hard disks, and flash memory may be utilized. Cabinet 7 also houses familiar computer components (not shown) such as a processor, memory, hard disk drives, and the like.

Figure 2:
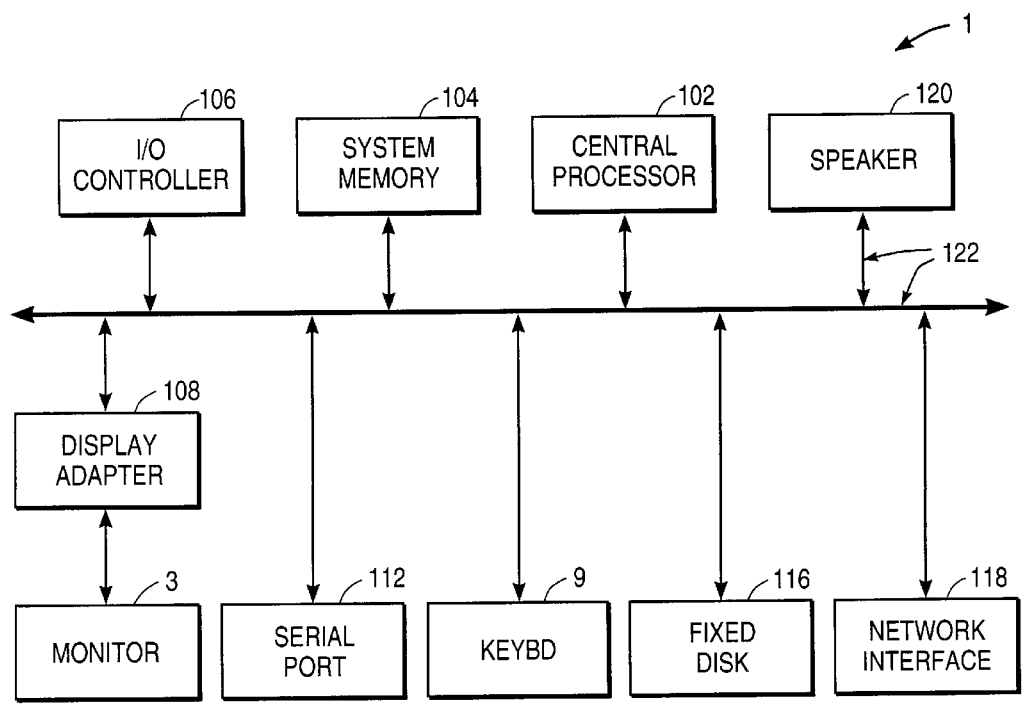
FIG. 2 shows a system block diagram of a typical computer system used to execute the software of the present invention.

FIG. 2 shows a system block diagram of computer system 1 used to execute the software of the present invention. As in FIG. 1, computer system 1 includes monitor 3 and keyboard 9. Computer system 1 further includes subsystems such as a central processor 102, system memory 104, I/O controller 106, display adapter 108, serial port 112, disk 116, network interface 118, and speaker 120. Other computer systems suitable for use with the present invention may include additional or fewer subsystems. For example, another computer system could include more than one processor 102 (i.e., a multi-processor system) or a system may include a cache memory.

Arrows such as 122 represent the system bus architecture of computer system 1. However, these arrows are illustrative of any interconnection scheme serving to link the subsystems. For example, speaker 120 could be connected to the other subsystems through a port or have an internal direct connection to central processor 102. Computer system 1 shown in FIG. 2 is but an example of a computer system suitable for use with the present invention. Other configurations of subsystems suitable for use with the present invention will be readily apparent to one of ordinary skill in the art.

Figure 3:
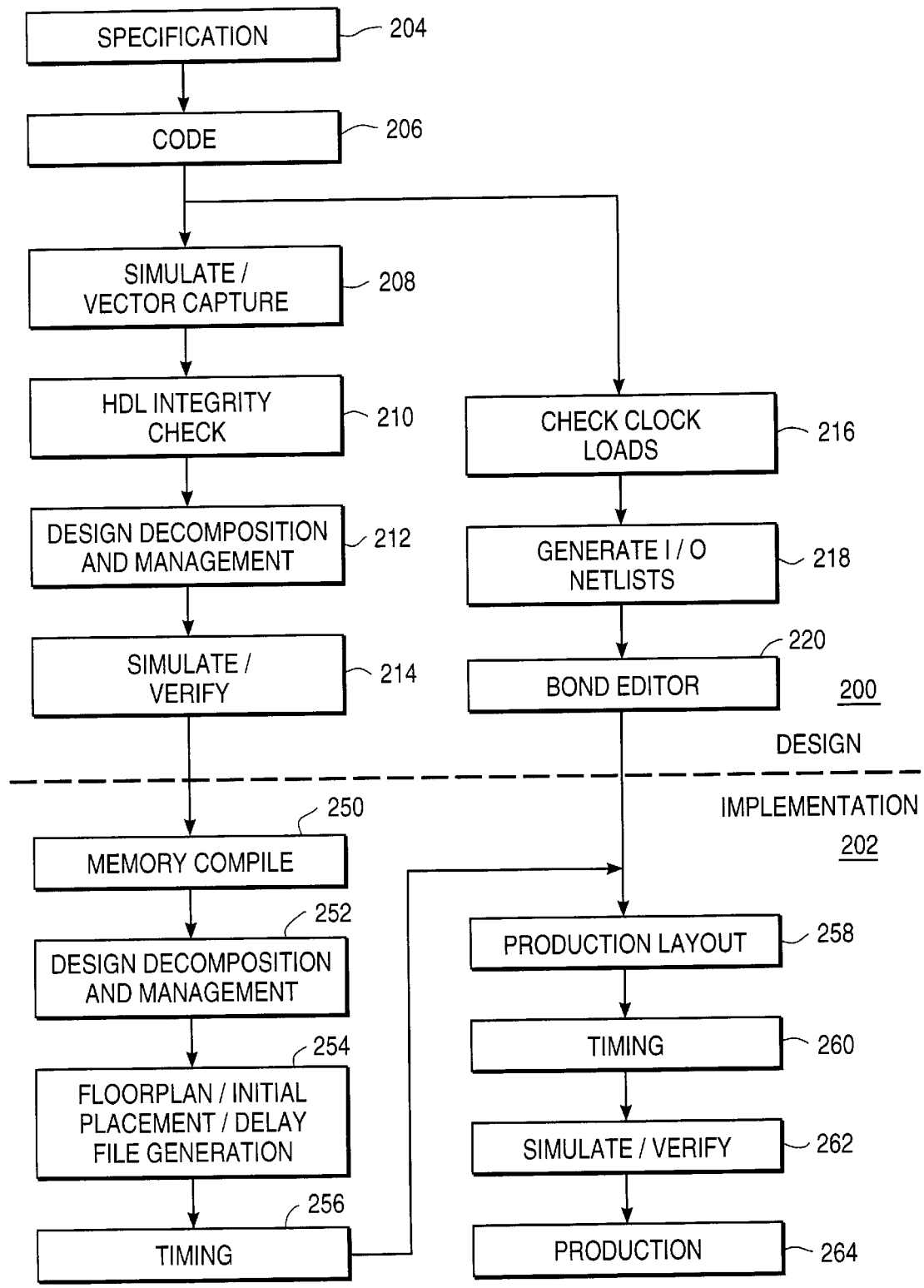
FIG. 3 shows a high level flow of the design and implementation phases of ASIC design according to the present invention.

FIG. 3 shows a high level flow of the design and implementation phases of ASIC design according to the present invention. The high level flow is representative of the flow that may be utilized according to the present invention to produce an ASIC. However, the flow is for illustration purposes and the present invention is not limited to the steps shown. ASIC production is broken down into two phases: a design phase 200 and an implementation phase 202. In the design phase, the ASIC customer works with design engineers at the foundry before passing information to the implementation engineers in the implementation phase.

At step 204, the customer produces the ASIC design specifications. The design specifications may include input/output (I/O), timing diagrams, state machines, power and thermal requirements, clocking, and floorplan area. The customer may also provide HDL source code or the foundry may help develop the code with the customer at step 206. The HDL code at this point is a behavioral specification of the ASIC. At step 208, the behavioral specification of the "ASCI" is simulated within the customer's system environment. Typically, the simulation is performed at the customer's site but it may also be performed at the foundry if practical.

During the simulation of step 208, the invention captures "golden" vectors that are used to test the ASIC during stand-alone simulation. The outputs generated by the ASIC during stand-alone simulation are then compared to the outputs generated during the system simulation. Thus, the customer's system simulation is reproduced without having to reproduce the customer's system environment which allows the operation of the ASIC to be verified during various states of synthesis as described below. Additionally, the test bench for testing the ASIC in stand-alone simulation is automatically generated thereby eliminating the need for the user to generate a test bench.

At step 210, the HDL code defining the ASIC are checked against rules and guidelines that ensure correct-by-construction designs. The rules and guidelines are formulated which specify conditions that, although syntactically correct, may result in unintended results, be inefficient, are hard to implement, or otherwise be undesirable. As described in more detail below, the rules specify conditions that should be remedied and guidelines specify conditions that warrant closer examination.

After the HDL code has been checked for integrity, synthesis scripts and hierarchical flow/connectivity diagrams are automatically generated at step 212. The user inputs design constraints, clock characteristics, technology files, and HDL code. The system handles cores, megafunctions, hardmacs, and black boxes appropriately for synthesis generating synthesis scripts and hierarchical flow/connectivity diagrams as described below. The synthesis scripts are designed according to a synthesis strategy designed for the synthesis tool. In one embodiment, the synthesis tool is Synopsys. The synthesis tool produces a gate-level HDL representation of the ASIC, however, synthesis at this stage typically does not take into account floorplanning and layout.

At step 214, the gate-level HDL representation of the ASIC is simulated in a stand-alone simulation. The input and test bench for the simulation were generated at step 208. The test bench simulates the customer's environment and the output from the stand-alone simulation is compared to the output from the system simulation. If the outputs are equal, the gate-level HDL representation of the ASIC is consistent with the behavioral specification. Although the flow in the design phase looks linear, it is really iterative. For example, steps 204 through 214, and any number of steps in between, may be repeated if a problem is detected. The iterative loops are not shown as a problem may surface at any step and an analysis of the problem dictates what step(s) need to be repeated. This iterative process in the design phase is called "exploratory synthesis."

Still referring to the design phase, the clock loads are checked at the chip level at step 216. An I/O netlist is generated at the chip level at step 218. The I/O netlist may be utilized to simulate the ASIC. At step 220, a bond editor is used.

After design phase 200 is complete, implementation phase 202 begins. Information such as HDL source code, synthesis constraint files, clock specifications, technology, memory and test specifications, bonding diagrams, golden vectors, and timing reports may be passed from the design engineers to the implementation engineers. The passing of information from the design phase to the implementation phase will be referred to as "handoff." The passing of information from the implementation phase to the design phase will be referred to as "handback." The present invention provides a method of exchanging information between the ASIC design engineers and the implementation engineers which stages the information in a designated area that is available to both design and implementation engineers.

In the implementation phase, any memories required by the design are compiled at step 250. At step 252, synthesis scripts and hierarchical flow/connectivity diagrams are automatically generated. A synthesis tool produces a gate-level HDL representation of the ASIC taking into account floorplanning and layout. At step 254, floorplanning, initial placement and delay file generation are performed. In one embodiment, CMDE is utilized.

At step 256, static timing analysis is performed. In one embodiment, the timing is performed with MOTIVE. Although the flow in the implementation phase looks linear, it is really iterative. For example, steps 250 through 256, and any number of steps in between, may be repeated if a problem is detected. The iterative loops are not shown as a problem may surface at any step and an analysis of the problem dictates what steps need to be repeated. This iterative process in the implementation phase is called "production synthesis."

At step 258, the production layout for the ASIC is produced. The timing of the ASIC is verified at step 260. At step 262, the gate-level HDL representation of the ASIC is simulated in a stand-alone simulation taking into account the floorplan. The input and test bench for the simulation were generated at step 208. The test bench simulates the customer's environment and the output from the stand-alone simulation is compared to the output from the system simulation. If the outputs are equal, the gate-level HDL representation of the ASIC and accompanying floorplan are consistent with the behavioral specification. At step 264, the ASIC is produced.

The high level flow in FIG. 3 may vary significantly in practice. For example, steps 214 and 250 may be optional depending on the ASIC. Additionally, a simulate/verify step like step 214 may be performed after step 252. Therefore, the specific steps are merely representative of one embodiment and others will vary depending on such factors as the customer, foundry, and ASIC desired.

Figure 4:
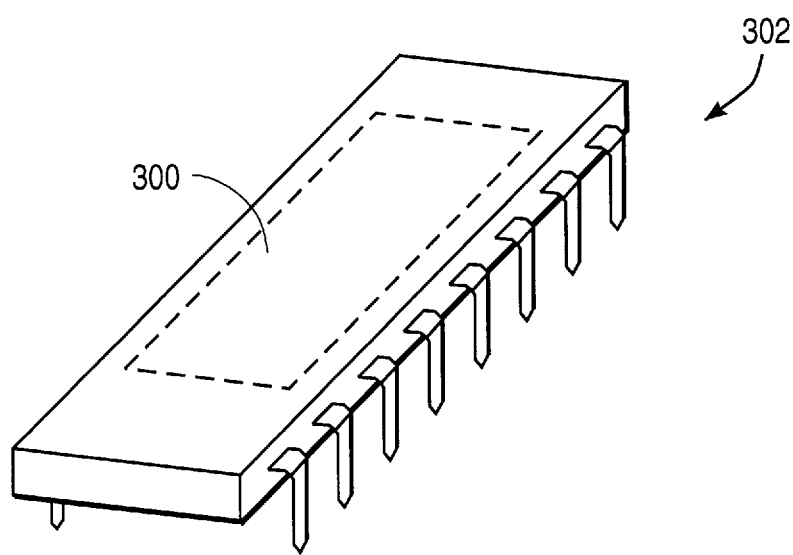
FIG. 4 is a packaged ASIC.

FIG. 4 is a packaged ASIC. An ASIC 300 is an integrated circuit specifically designed to suit the customer's specifications. The ASIC is then packaged into an ASIC package 302 by any number of packaging technologies known to those skilled in the art.

Vector Capture

The present invention provides methods of verifying the design of the ASIC. During system simulation, the invention captures "golden" vectors that may be used to test the ASIC during stand-alone simulation. The outputs generated by the ASIC during stand-alone simulation are compared to the outputs generated during the system simulation. Thus, the customer's system simulation is reproduced without having to reproduce the customer's system environment which allows the operation of the ASIC to be verified during various states of synthesis. Additionally, the test bench for testing the ASIC in stand-alone simulation is automatically generated obviating the need for the user to generate a test bench.

Figure 5:
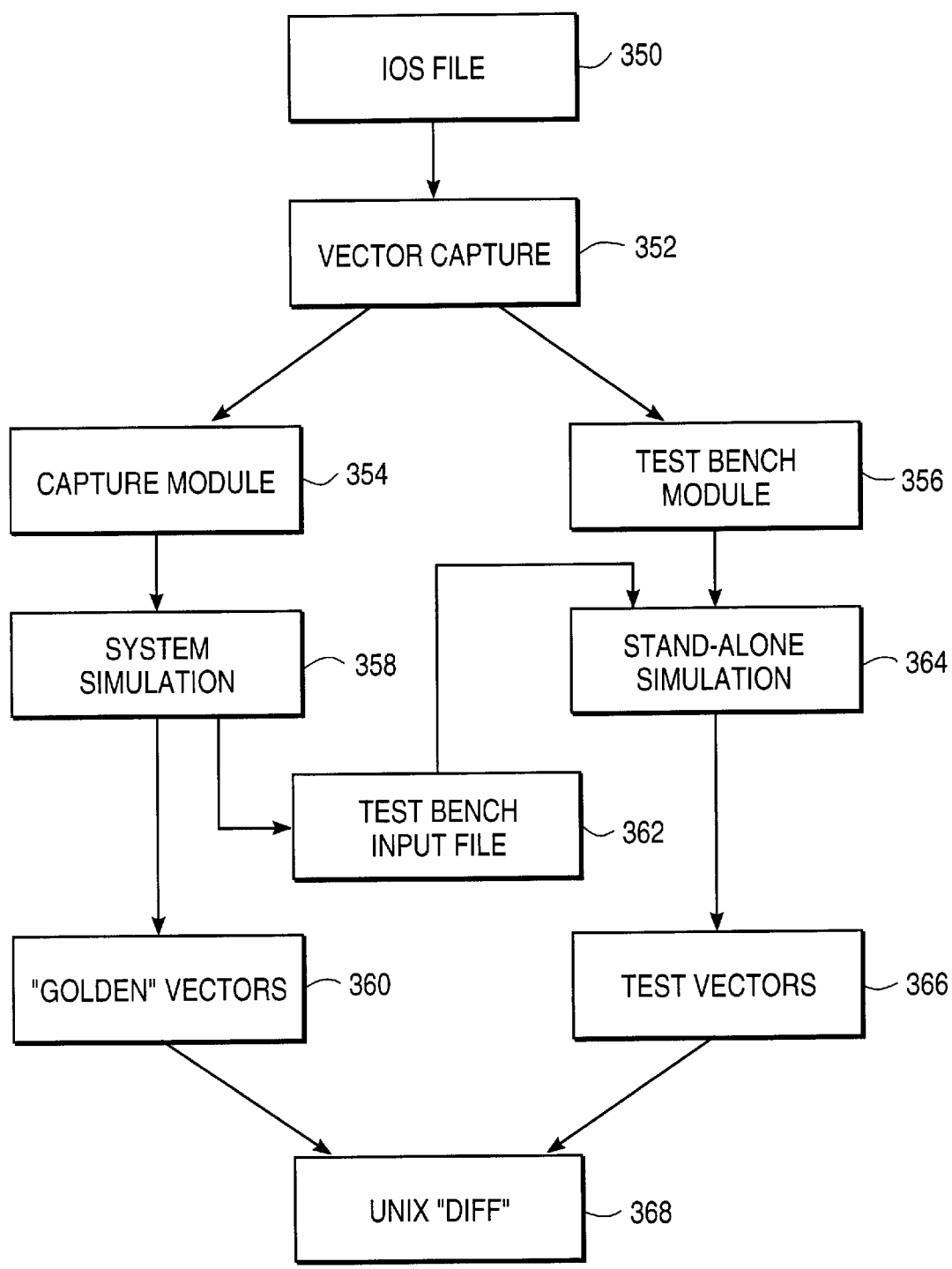
FIG. 5 shows the high level flow of Vector Capture and verification by system and stand-alone simulation.

FIG. 5 shows the high level flow of Vector Capture and verification by system and stand-alone simulation. An input/output specification (IOS) file 350 is input to the Vector Capture program 352. The IOS file contains the I/O specifications of the ASIC. The IOS file consists of three parts: port definitions, strobes, and bidirect enable definitions. A sample IOS file in Verilog HDL is as follows:

input [3:0] si;

input rw;

output [63:0] dbus;

output srdy_1;

output pout;

inout dav;

input tbd;

strobe strb1 period 20 start 19 stop 0 outputs pout dav dbus;

strobe srtb2 period 10 start 9 stop 0 outputs srdy_1;

bdenable tbd inouts dav; In preferred embodiments, the format of the IOS file is fixed, irrespective of whether the design is Verilog or VHDL.

The port definitions describe the I/O port/pins of the ASIC. The port definitions may be input by the user. The strobes section specify the appropriate time to capture expected vectors. In the sample IOS file, all outputs are assumed to be synchronous and periodical such that the line "strobe strb1 period 20 start 19 stop 0 outputs pout dav dbus" will instruct the simulators to extract output vectors every 20 ns on the signals pout, dav and dbus starting 19 ns into the cycle. The bidirect enable definitions describe the direction of the bidirectional signals connected to the ASIC.

The Vector Capture program generates two output modules: a capture module 354 and a test bench module 356. The capture module is an HDL file that is utilized during a system simulation 358 to capture the input and output vectors around the ASIC. Typically, the system simulation utilizes a behavioral HDL representation of the ASIC. During system simulation 358, the output vectors of the ASIC are captured as "golden" vectors 360. The golden vectors represent the output of the ASIC during system simulation. The system simulation also captures the input vectors to the ASIC during system simulation. The input vectors are stored as a test bench input file 362 so that the ASIC during stand-alone simulation will receive the same inputs as in system simulation.

Test bench module 356 contains HDL code to perform a stand-alone simulation 364 of the ASIC. The stand-alone simulation receives as input the test bench input file generated during system simulation. The stand-alone simulation reproduces the customer's system simulation without having to reproduce the customer's system environment. This allows the operation of the ASIC to be verified during various stages of synthesis at the foundry where the customer's system may not be readily available. The stand-alone simulation may utilize a behavioral or structural HDL representation of the ASIC depending on the stage of synthesis of the ASIC. The stand-alone simulation generates output test vectors 366.

Verifying the representation of the ASIC entails comparing the "golden" vectors to the test vectors. If the golden and test vectors are identical, then the representation of the ASIC used during stand-alone simulation is the same as the customer's original behavioral model. The comparison may be performed by a UNIX "diff" command 368 which compares two files to determine their differences.

Additionally, the Capture may be utilized to test the generation of a gate level model from an RTL model. The same inputs are utilized to generate outputs from both models of the ASIC. The outputs are compared to verify that the gate level model is an accurate depiction of the ASIC.

Figure 6:
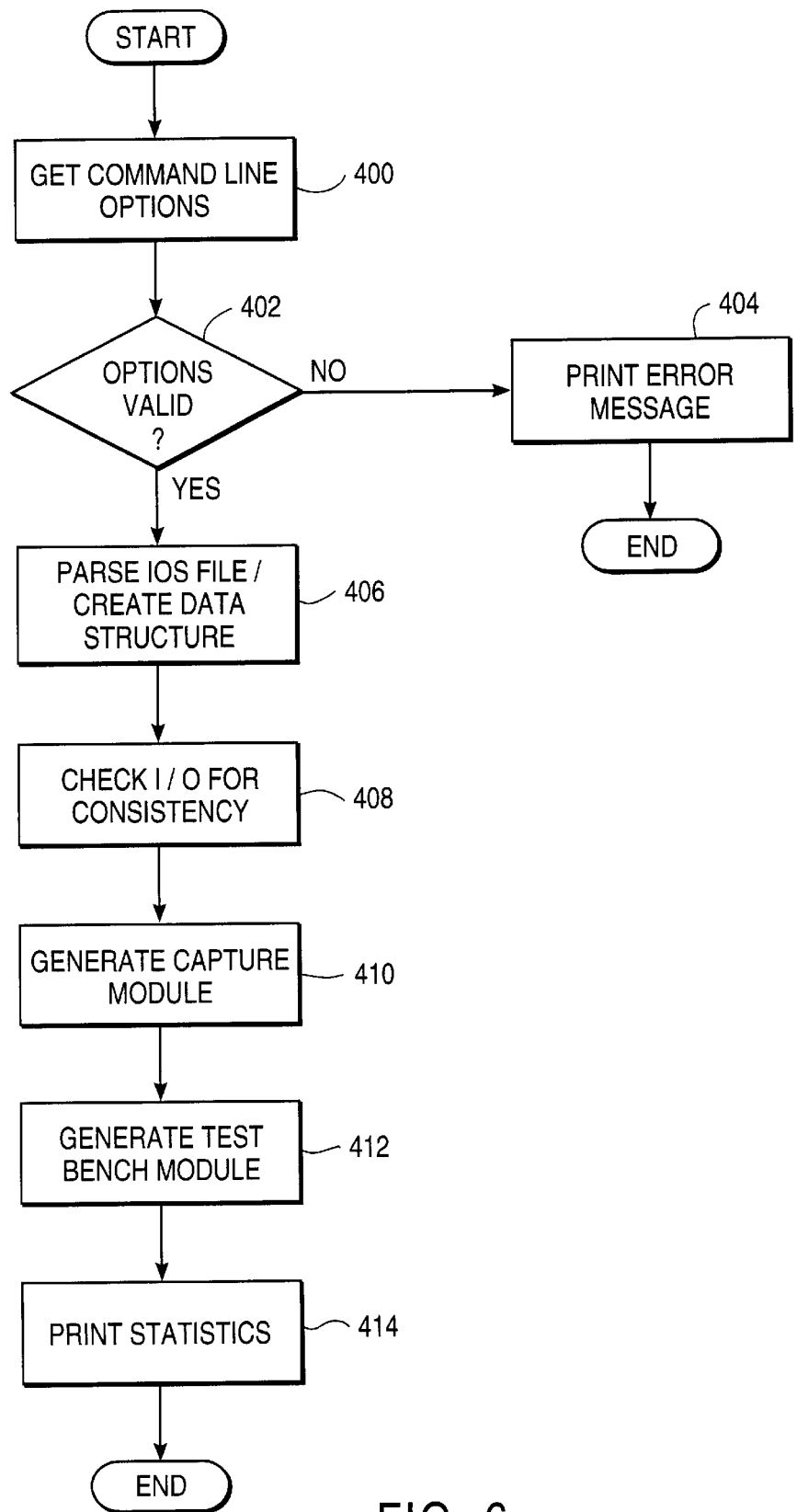
FIG. 6 shows the high level flow of the Vector Capture program.

FIG. 6 shows the high level flow of the Vector Capture program. At step 400, the system retrieves and processes the command line options or arguments. The command line options include a specification of the IOS file for the ASIC. Parameters are then set according to the options specified by the command line. Any remaining parameters are set according to default values. As the command line options are being processed, the system checks the validity of the options specified at step 402. If the command line options are invalid, an error message is printed at step 404. Otherwise, the Vector Capture program continues.

At step 406, the system parses the IOS file and creates the appropriate data structures for the I/O specified in the IOS file. The system checks the I/O for consistency at step 408. Checking the I/O for consistency entails verifying that all the outputs and inouts (bidirectionals) in the IOS file have associated strobes. Additionally, all the inouts should have associated BDENABLE statements to enable the bidirectionals.

At step 410, the system generates the capture module. The process of generating the capture module will be discussed in more detail in reference to FIG. 7. The system generates the test bench module at step 412. The process of generating the test bench module will be discussed in more detail in reference to FIG. 8. The system prints statistics at step 414.

Figure 7:
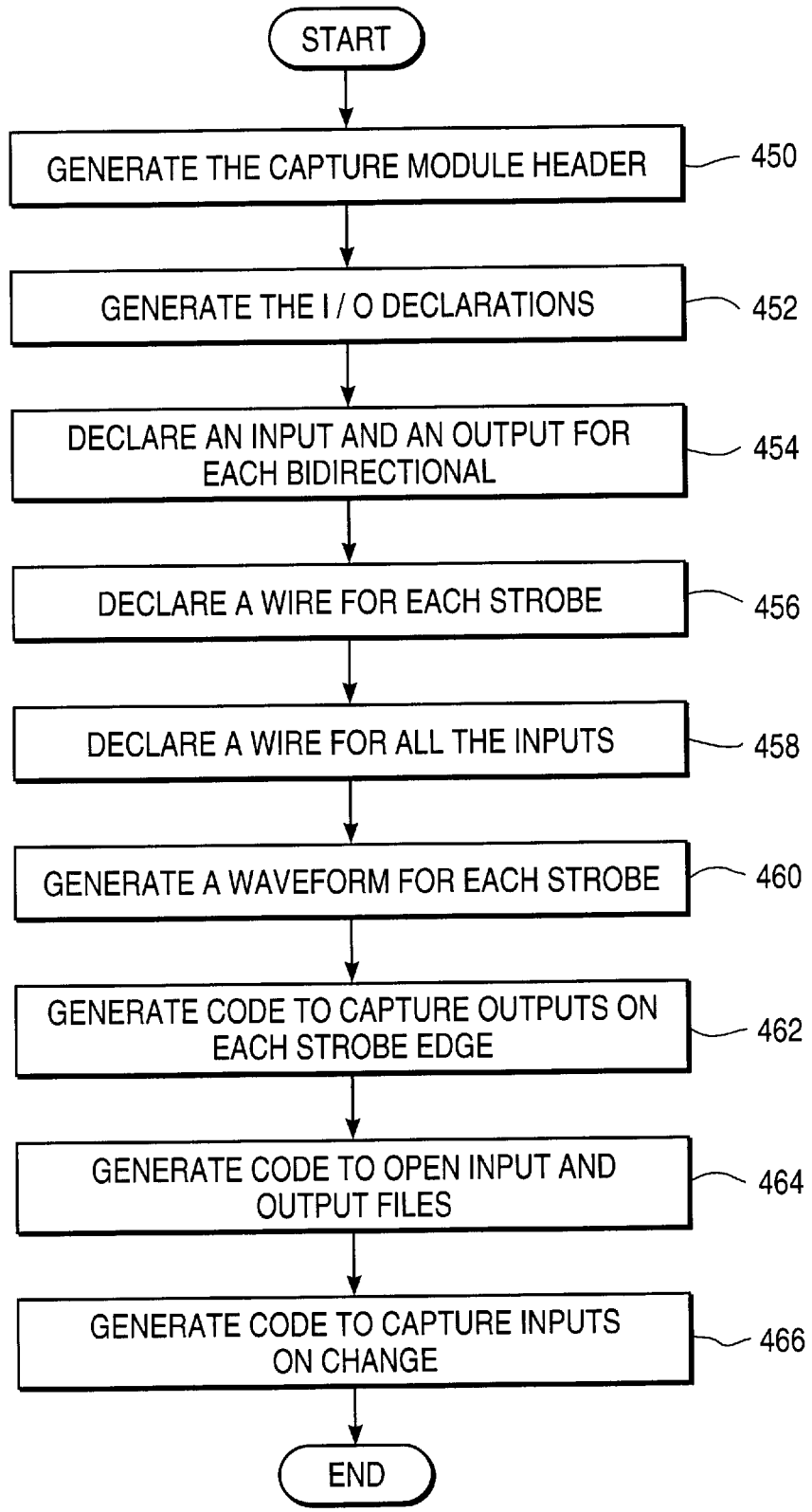
FIG. 7 shows the process of generating the capture module.

FIG. 7 shows the process of generating the capture module. The Vector Capture program generates the capture module which is an HDL file that is utilized during a system simulation to capture the input and output vectors around the ASIC. At step 450, the system generates the capture module header. The I/O declarations are generated at step 452.

At step 454, the system declares an input and an output for each inout or bidirectional. A wire (bus) is declared for each input and output. The input and output for an inout are combined using the associated BDENABLE signal which specifies whether the inout is an input or an output. Code is generated that assigns the inout to the input wire or the output wire depending on the value of the input test signal.

At step 456, the system declares a wire (bus) for each strobe to hold all the related outputs. The system also declares parameters that hold the user inputs for each strobe. At step 458, the system declares a wire (bus) for all the inputs.

The system generates a waveform for each strobe at step 460. The start time and period are specified for each strobe. At step 462, the system generates code to capture outputs on each strobe edge. The system generates code to open a single input file and one output file for each output. At step 466, the system generates code to capture inputs on change and the capture module has been generated.

Figure 8:
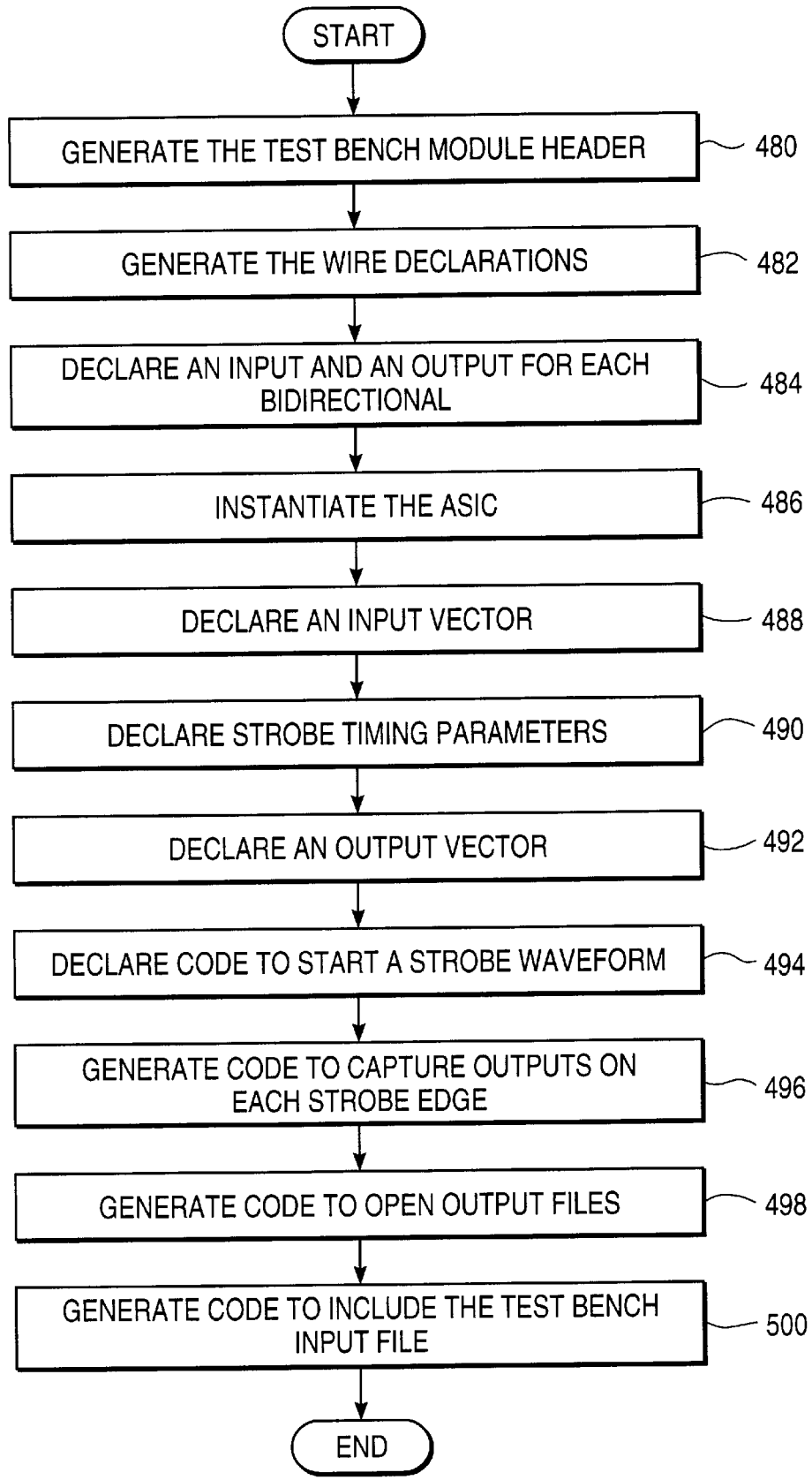
FIG. 8 shows the process of generating the test bench module.

FIG. 8 shows the process of generating the test bench module. The Vector Capture program generates the test bench module which contains HDL code to perform a stand-alone simulation of the ASIC. The stand-alone simulation receives as input the test bench input file generated during system simulation. At step 480, the system generates the test bench module header. The wire declarations are generated at step 482.

At step 484, the system declares an input and an output for each inout or bidirectional. A wire (bus) is declared for each input and output. The input and output for an inout are combined using the associated BDENABLE signal which specifies whether the inout is an input or an output. Code is generated that assigns the inout to the input wire or the output wire depending on the value of the associated BDENABLE signal.

The system instantiates the ASIC at step 486. At step 488, the system declares an input vector with a width equal to the sum of all the inputs and the input halves of the bidirectionals. The individual input and bidirectionals are also assigned to the input vector.

At step 490, the system declares strobe timing parameters as specified by the user in the IOS file. In one embodiment, the strobe timing parameters are in pico seconds. The system declares an output vector with a width equal to all the sum of all the outputs and the output halves of the bidirectionals at step 492.

At step 494, the system declares code to start a strobe waveform with the appropriate start time and period as specified by the user in the IOS file. The system generates code to capture appropriate outputs on each strobe edge at step 496.

The system generates code to open output files at step 498. At step 500, the system generates code to include the test bench input file that was generated during system simulation. The test bench input file allows the ASIC to be simulated as the system simulation in the customer's environment. Fork and join calls may be used to include the test bench input file because the time values are absolute. Thus, the test bench module is generated.

HDL Expert System

The present invention provides rule-based methods of ensuring correct-by-construction designs. Rules and guidelines are formulated which specify conditions that, although the syntax is correct, may result in unintended results, be inefficient, are hard to implement, or otherwise be undesirable. After the HDL code is syntactically verified, the code is analyzed with respect to the rules and guidelines. Rules specify conditions that should be remedied and guidelines specify conditions that warrant closer examination. In a preferred embodiment, the rules and guidelines include categories such as HDL design/coding, scan design, and foundry specific implementation. Appendix A sets forth exemplary rules and guidelines.

Figure 9:
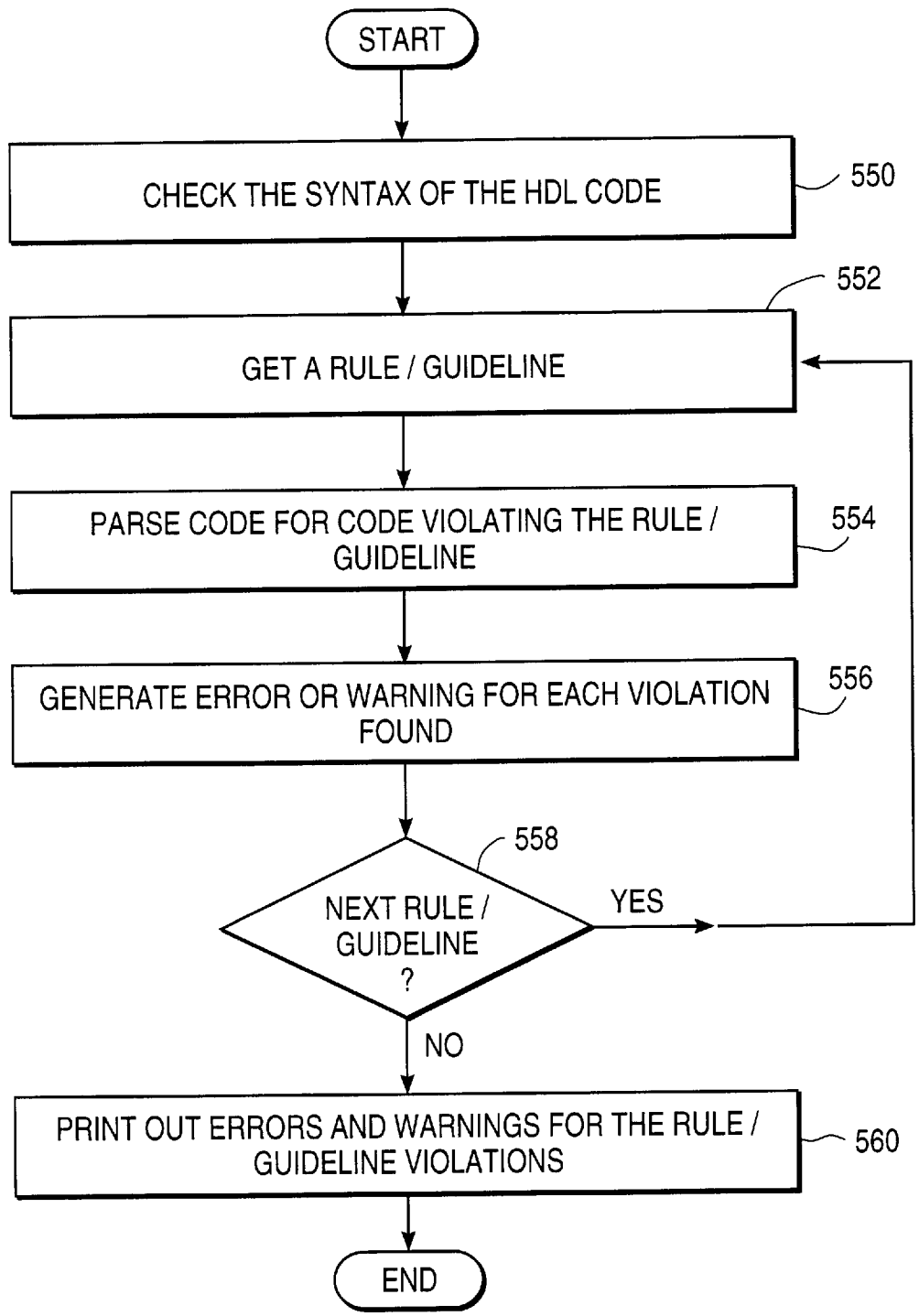
FIG. 9 shows the high level flow of HDL Expert System.

FIG. 9 shows the high level flow of HDL Expert System. At step 550, the system checks the syntax of the HDL code. Checking the syntax of HDL code includes verifying that the statements and expression in the code are valid. However, HDL code that has correct syntax does not necessarily imply that the code reflects what the programmer intended (semantics) or that the code will be efficient to implement. Typically, the syntax is checked by the HDL compiler.

The system of the present invention stores rules and guidelines to help ensure correct-by-construction design. If a rule is violated, an error is generated indicating the code should be corrected. Guidelines do not necessarily imply there is an error so if a guideline is violated, a warning is generated indicating the code warrants closer examination. The rules and guidelines allow the design process to be more streamlined and automated. Simulators and synthesis tools generally do not parse the code to check for these situations defined by the rules and guidelines. As a result, the design process may be substantially more difficult. For example, the rules may specify a situation that is simulatable and synthesizeable, but will yield unintended results that are often difficult to understand and locate.

In a preferred embodiment, the rules and guidelines fall into three categories: HDL design/coding, scan design, and foundry specific implementation. The HDL design/coding rules and guidelines are generic and valid with different synthesis tools. The scan design rules and guidelines are also generic. The foundry specific implementation rules and guidelines streamline the design and implementation of an ASIC for a specific foundry taking into account the foundry's design tools, processes, methodologies, libraries, and the like.

Figure 10:
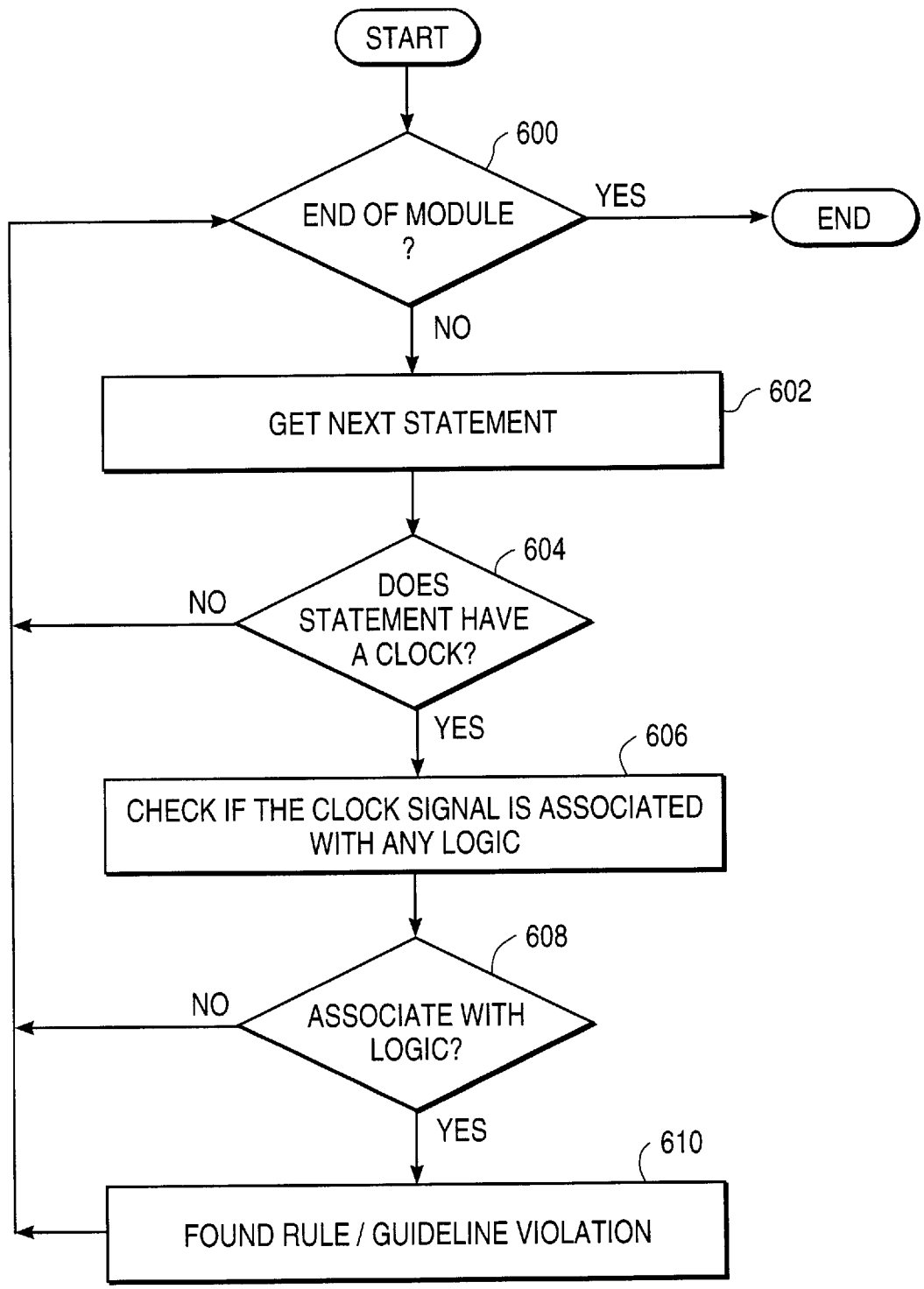
FIG. 10 shows the process of checking a rule that gated clocks are not to be used.
Figure 11:
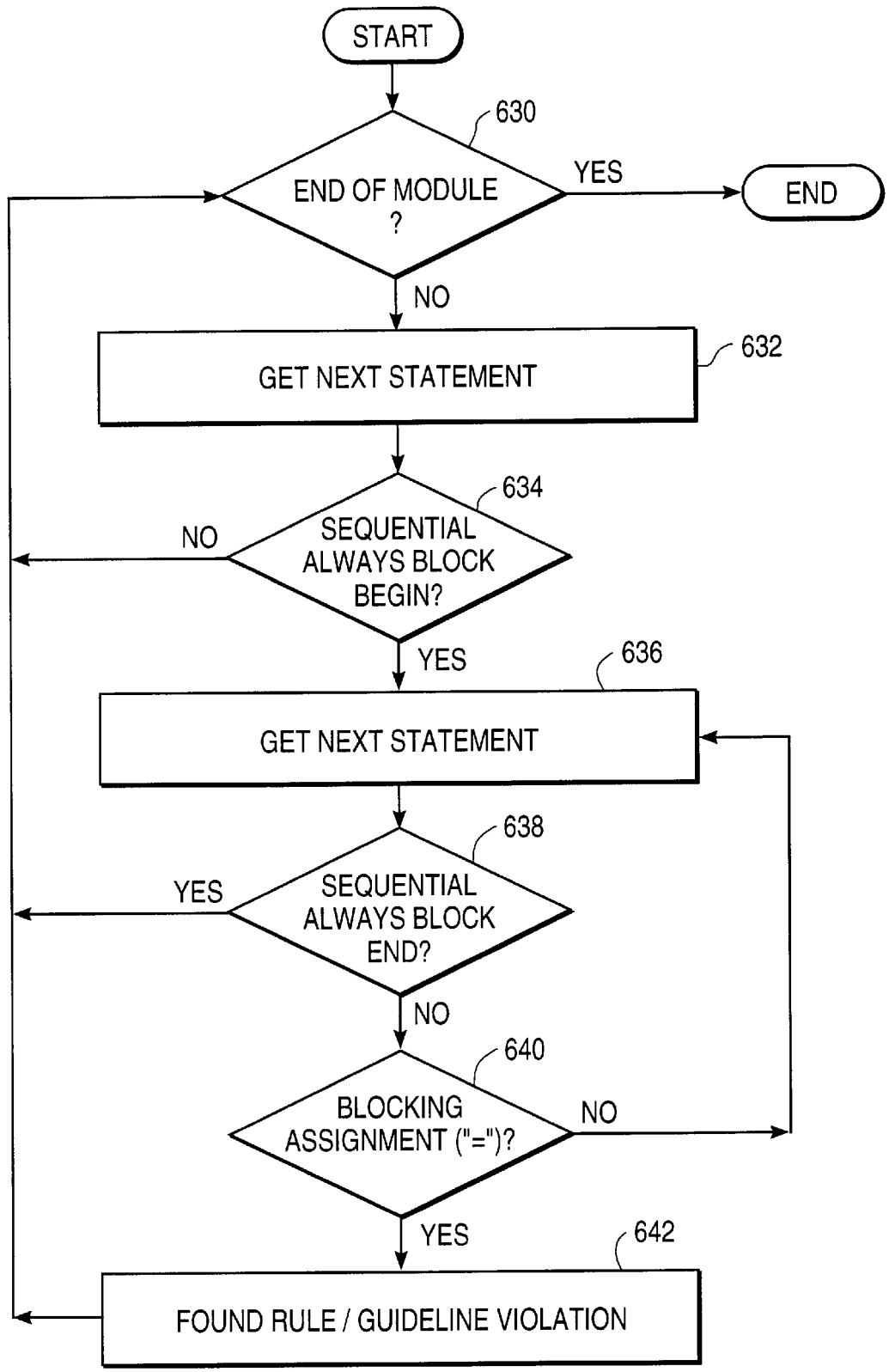
FIG. 11 shows the process of checking a rule that all assignments within sequential procedural blocks must be nonblocking.

At step 552, the system retrieves a rule or guideline. The system then parses the HDL code to identify code that violates the rule or guideline. Each rule and guideline is violated by specific code structures or statements. As the code that violates a rule or guideline varies, each rule or guideline may be associated with a routine that determines if HDL code violates the rule or guideline. FIGS. 10 and 11 illustrate two of these routines.

Still referring to FIG. 9, the system generates an error or warning for each violation found at step 556. A violation of a rule generates an error indicating that the code should be corrected. A violation of a guideline generates a warning indicating that the code should be examined to determine if correction is required.

At step 558, the system determines if there is another rule or guideline to check. If there is, the system retrieves the next rule or guideline to check the code. Otherwise, the HDL integrity checking is complete and the system prints out the errors and warnings generated by the rule and guideline violations, respectively. The errors and warnings include the location of the violation, the associated rule or guideline, and a suggestion on how to correct the violation. Typically, the errors and warnings are saved in a file so the user is able to look at the information on the screen or have it printed out.

An example of a rule is that gated clocks should not be used. A gated clock is a clock signal that is associated with any logic that is not a valid clock terminator. All clock networks should be "pure" because the use of gated clocks significantly complicates timing analysis, the construction of a properly balanced clock tree at the gate level, and the testing of the ASIC. The Appendix provides coding examples of the use of gated clocks.

FIG. 10 shows the process of checking a rule that gated clocks are not to be used. The process shown is for an individual module. Multiple modules may be checked by iteratively repeating this process. At step 600, the system determines if the end of the module has been reached. If not, the system retrieves the next statement in the module at step 602.

At step 604, the system determines if the statement contains a clock signal. Signals are identified as clocks if they trigger events on their edges instead of by their level. If the statement includes a clock signal, the system determines if the clock signal is associated with any logic at step 606. If the clock signal is associated with constrained logic at step 608, the statement violates the rule that gated clocks should not be used. The system identifies the statement as violating the rule and stores the location of the statement along with the rule that was violated at step 610.

Another example of a rule is that all assignments within a sequential procedural block should be nonblocking. Although each assignment in a sequential procedural block implies a hardware register, using a nonblocking assignment (e.g., "<=") will ensure that there is an associated hardware register. A blocking assignment (e.g., "=") may imply a register but the order of execution of assignments becomes important. In order to avoid the problem of the lack of hardware registers resulting from the order of blocking assignments, nonblocking assignments should be used. The Appendix provides coding examples of the use of blocking and nonblocking assignments.

FIG. 11 shows the process of checking a rule that all assignments within sequential procedural blocks must be nonblocking. The process shown is for an individual module. Multiple modules may be checked by iteratively repeating this process. At step 630, the system determines if the end of the module has been reached. If not, the system retrieves the next statement in the module at step 632.

At step 634, the system determines if the statement is a sequential "always" block begin in Verilog (or sequential process statement in VHDL). An example of a sequential always block begin is the begin that follows a statement like "always @(posedge clk)." Once the system is with a sequential always block, the system retrieves the next statement at 636. The system then determines if the statement is a sequential always block end at step 638. If it is, the sequential always block has been processed.

At step 640, the system determines if the statement specifies a blocking assignment (e.g., "="). If not, the system retrieves the next statement as the rule is not violated. If the statement does specify a blocking assignment, the statement violates the rule that all assignments with a sequential procedural blocks should be nonblocking. The system identifies the statement as violating the rule and stores the location of the statement along with the rule that was violated at step 642.

FIGS. 10 and 11 show two processes for checking for a rule violation and other processes will vary depending on the specific rule or guideline. As the process will vary depending on the rule or guideline, the present invention is not limited to any particular process for checking for rules or guidelines violations. In a preferred embodiment, regression tests are utilized to test the performance of the HDL Expert System in detecting rules or guidelines violations.

Design Decomposition

The present invention also provides methods of automatically generating synthesis scripts and hierarchical flow/connectivity diagrams. The user inputs design constraints, clock characteristics, technology files, and HDL code. The system handles cores, megafunctions, hardmacs, and black boxes appropriately for synthesis. During synthesis, individual modules in the HDL code may change. The system manages these incremental changes by generating incremental scripts which 1) compile, map and model the modules that have been changed and 2) characterize, compile and model the modules that have been changed and the hierarchy under that instance. During the iterative design process, new hierarchical flow diagrams may be generated to understand the full effect of the incremental changes.

Figure 12:
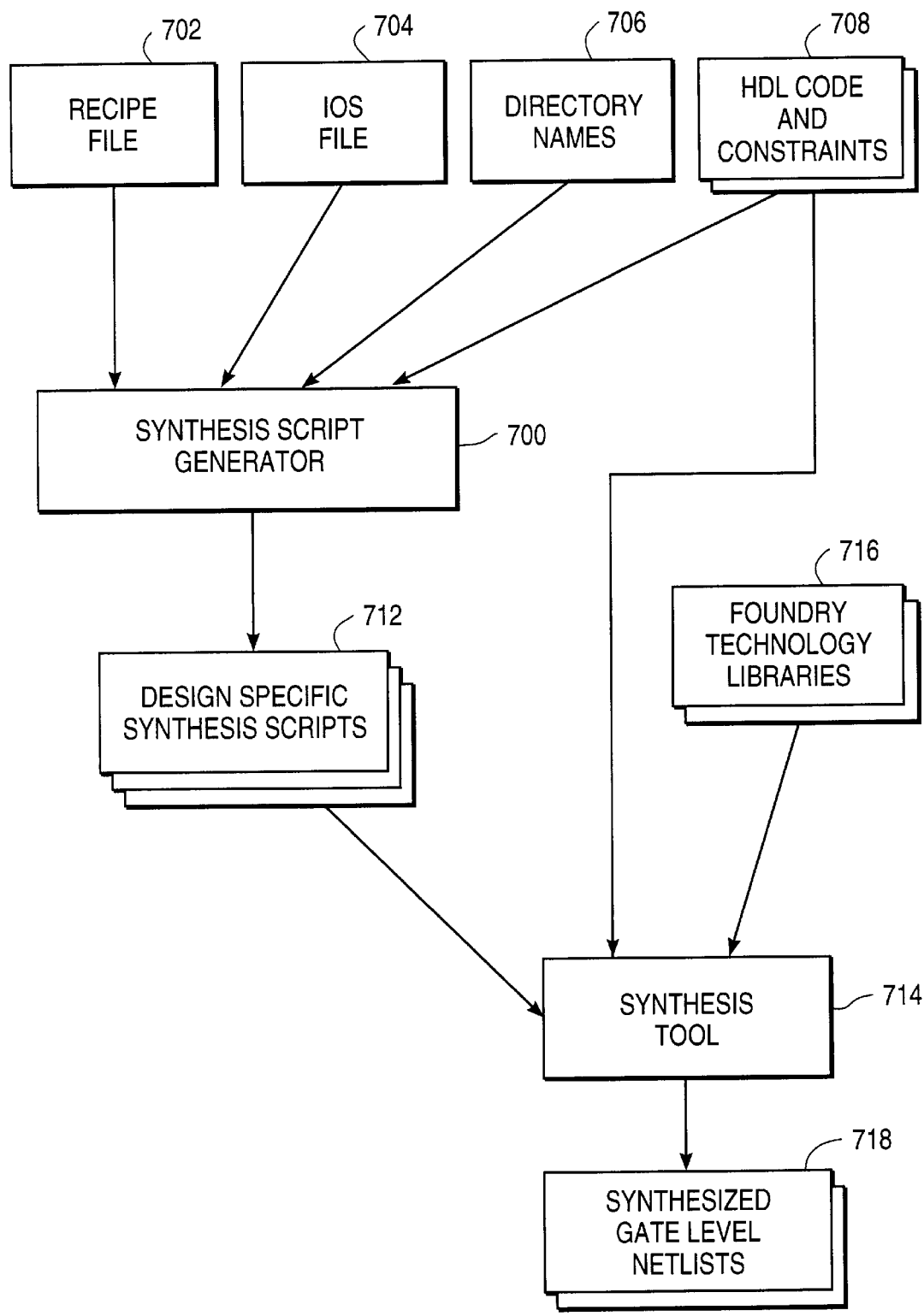
FIG. 12 shows the high level flow of the Design Decomposition in association with a synthesis tool.

FIG. 12 shows the high level flow of the Design Decomposition in association with a synthesis tool. A synthesis script generator receives as input a recipe file 702, an input/output specification (IOS) file 704, a directory names file 706, and a customer's HDL code and constraints files 708. The recipe file specifies a synthesis strategy and may be optimized for a particular synthesis tool or design. The IOS file contains the I/O specifications of the ASIC. The directory names file specifies the location of the customer's HDL code and constraint files.

Synthesis script generator 700 automatically generates design specific synthesis scripts for use with a synthesis tool. In one embodiment, the synthesis script generator handles cores, megafunctions, hardmacs, and black boxes appropriate for synthesis. The synthesis script generator also counts the number of module instances used in a design, handles them appropriately, and provides a count to the user.

Synthesis script generation is an iterative process that lends itself well to design management. Typically, changes to the design of the ASIC do not occur throughout the entire design, but are limited to certain modules. The synthesis script generator manages these incremental changes by generating incremental scripts which 1) compile, map and model the modules that have been changed and 2) characterize, compile and model the modules that have been changed and the hierarchy under that instance. The need for design management also occurs because the entire design may not be ready for synthesis at the same time; as the various pieces are completed, they may be passed off for synthesis.

The synthesis script generator can generate a script to synthesize portions of the design hierarchy on different processes based upon an understanding of the design hierarchy. The processes may be run locally on the same workstation or on other computer systems. As synthesis may be performed simultaneously on unrelated portions of the design hierarchy, the speed of the synthesis process is significantly increased.

Synthesis scripts 712 are input into a synthesis tool 714. In a preferred embodiment, the synthesis tool is from Synopsys of Mountain View, Calif. However, other synthesis tools may be utilized. The synthesis tool also receives as input HDL code and constraints files 708 and foundry technology libraries 716. The foundry technology libraries include specifications for technology available at the foundry. The synthesis tool produces synthesized gate level netlists 718.

Figure 13:
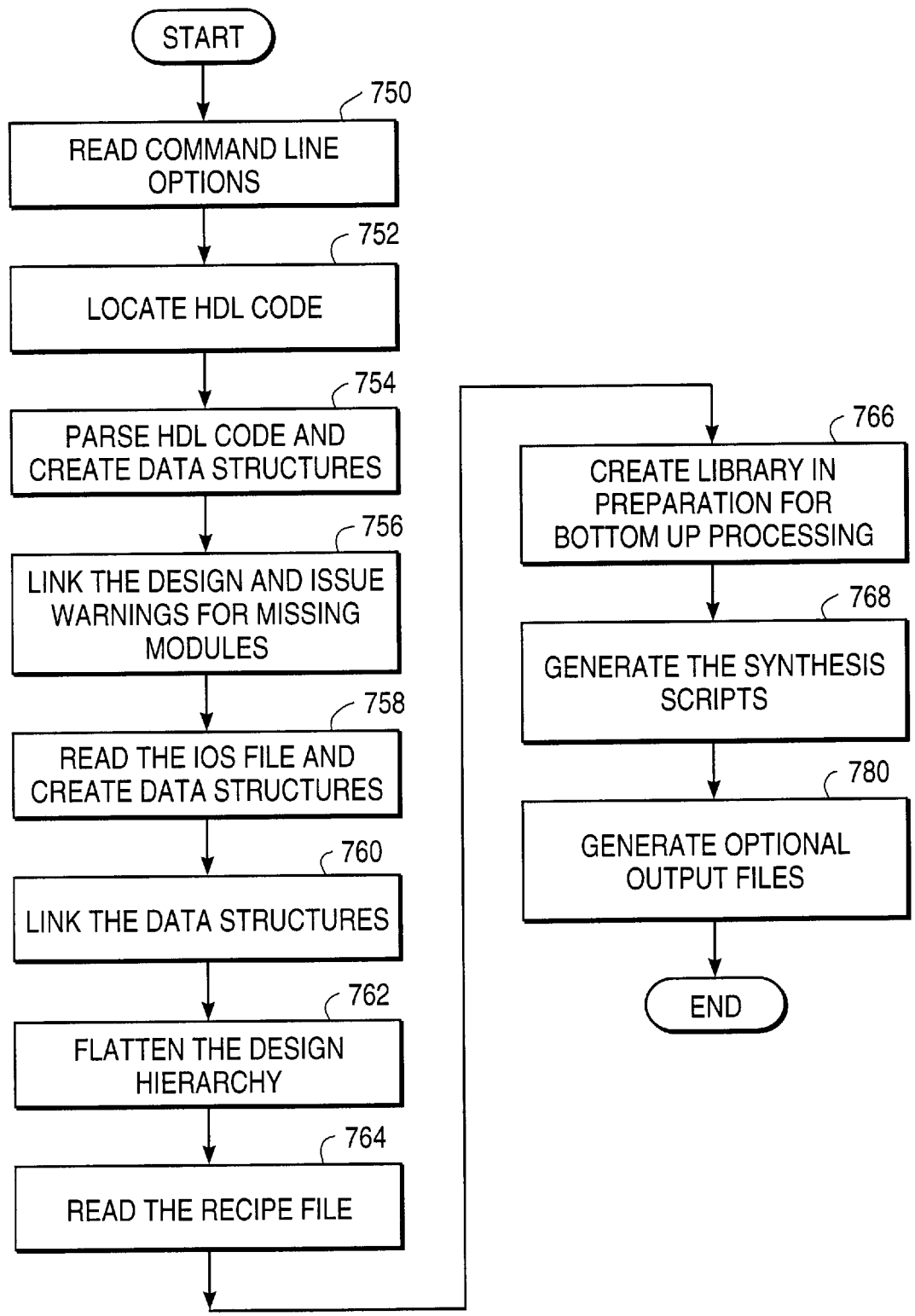
FIG. 13 shows the high level flow of the Design Decomposition.

FIG. 13 shows the high level flow of the Design Decomposition. At step 750, the system reads in the command line options. The system sets global variables and defaults according to the command line options. The system then locates the HDL code files at step 752. In a preferred embodiment, a file contains the directory names (i.e., location) of the customer's HDL code that specifies the ASIC.

At step 754, the HDL code is parsed and the appropriate data structures are created. During script generation, the hierarchy port names and instantiations are utilized while pure behavioral code is skipped. The system then links the design and issues warnings to the user if there are any missing modules at step 756.

The system reads the IOS file and creates the appropriate data structures at step 758. The IOS file typically includes information such as clock characteristics. At step 760, the system links the data structures created when the HDL code was parsed and the data structures created from the IOS file.

At step 762, the system flattens the design hierarchy and assigns a uniquify (unique) identification to each instance in the design. The system then reads the recipe file and adds the information therein to the flattened design hierarchy at step 764. The recipe file may be a design specific synthesis recipe for changing the hierarchy of the ASIC. Additionally, the recipe file may be a design specific synthesis recipe specifying areas of the ASIC that should not be altered by the synthesis tool.

At step 766, the system creates a library in preparation for bottom up processing. At step 768, the synthesis scripts are automatically generated. This process will be described in more detail in reference to FIG. 14.

The system generates optional output files at step 780. The optional output files include hierarchical flow diagrams and connectivity diagrams as specified by the user.

Figure 14:
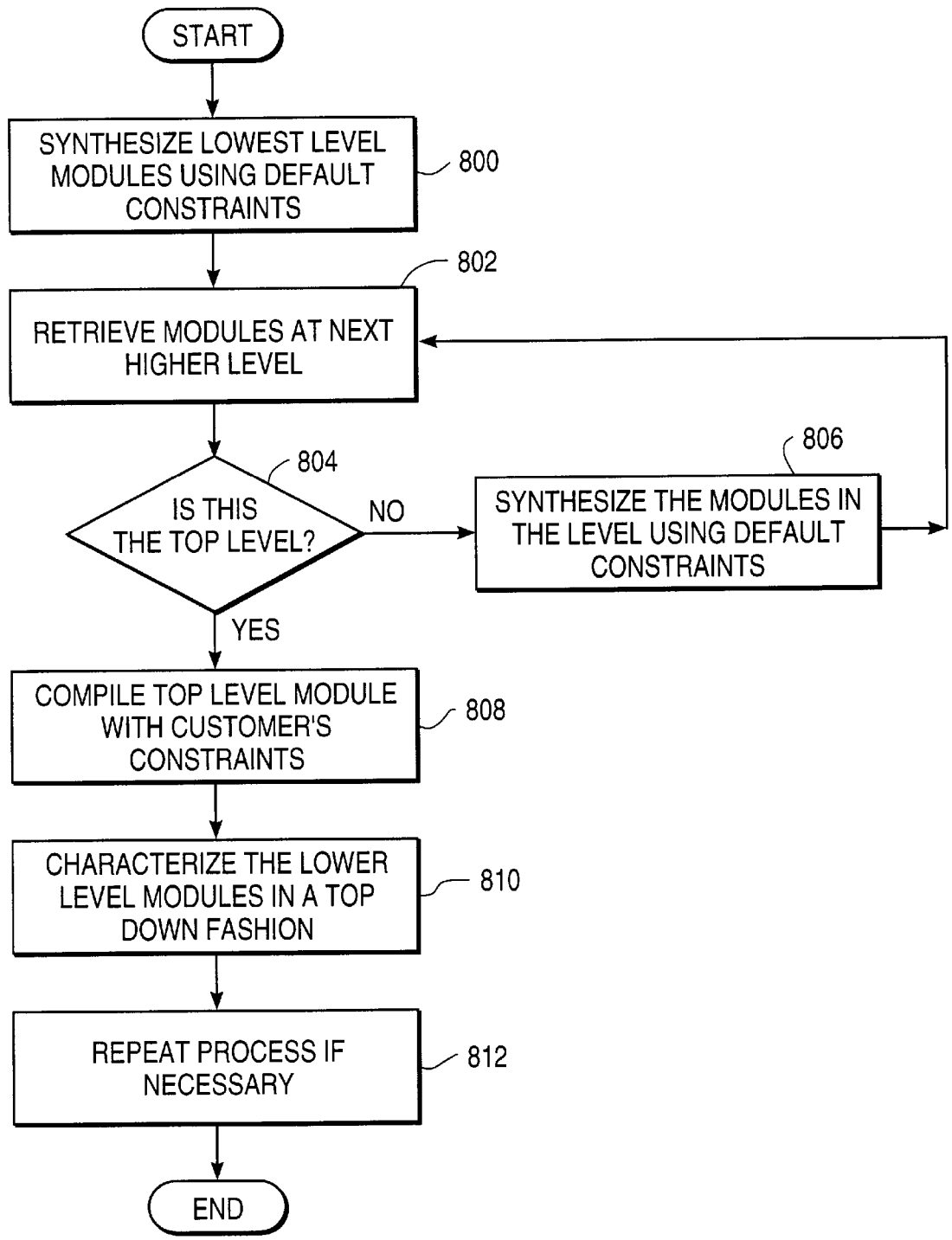
FIG. 14 shows the process generating synthesis scripts in a bottom up fashion.

FIG. 14 shows the process generating synthesis scripts in a bottom up fashion. At step 800, the system synthesizes the lowest level modules using default constraints. As the modules are synthesized they are converted to black boxes. The modules at the next higher level are retrieved at step 802. If the modules at the next higher level are not the top level module at step 804, the system synthesizes these modules using default constraints. Thus, the system synthesizes the modules in a bottom up fashion until the top level module is encountered.

At step 808, the system compiles the top level module with the customer's constraints. After the top level module is compiled, the system characterizes the other modules in a top down fashion. Optionally, the synthesis scripts may allow a user to repeat this process if desired. For example, the user may modify some constraints at the lower levels for the next iteration.

Synthesis scripts may be executed on different processors in parallel. This may be done by parallelizing execution of the synthesis scripts according to hierarchy level and merging parallel synthesis scripts into the next higher level until the top is reached. Additionally, a timing representation may be generated that is utilized during the synthesis in place of a module throughout the synthesis process in order to decrease synthesis time and/or minimize memory space required.

Figure 15A:
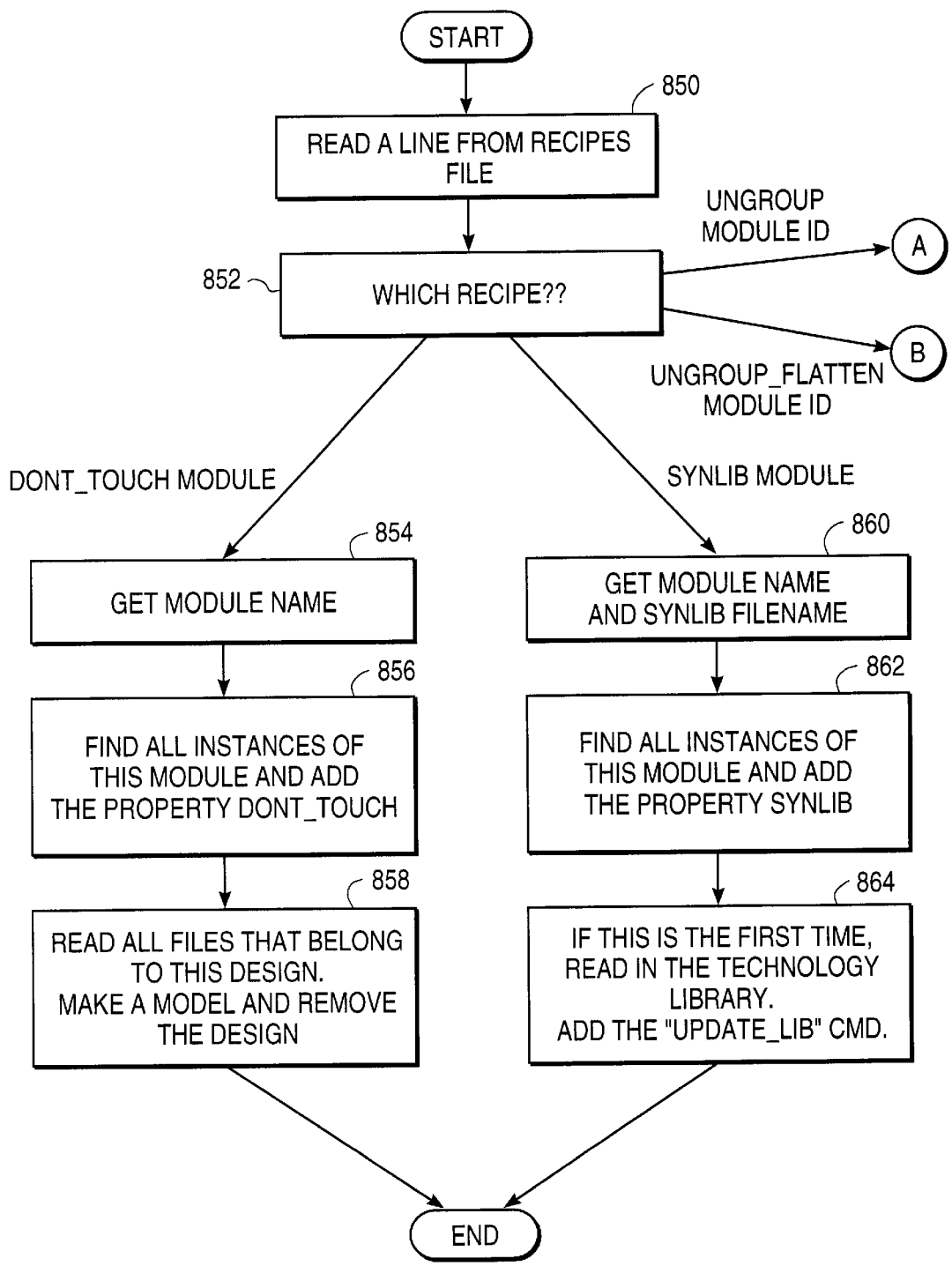
FIGS. 15A–15C show the flow of processing a recipe file during script generation.
Figure 15B:
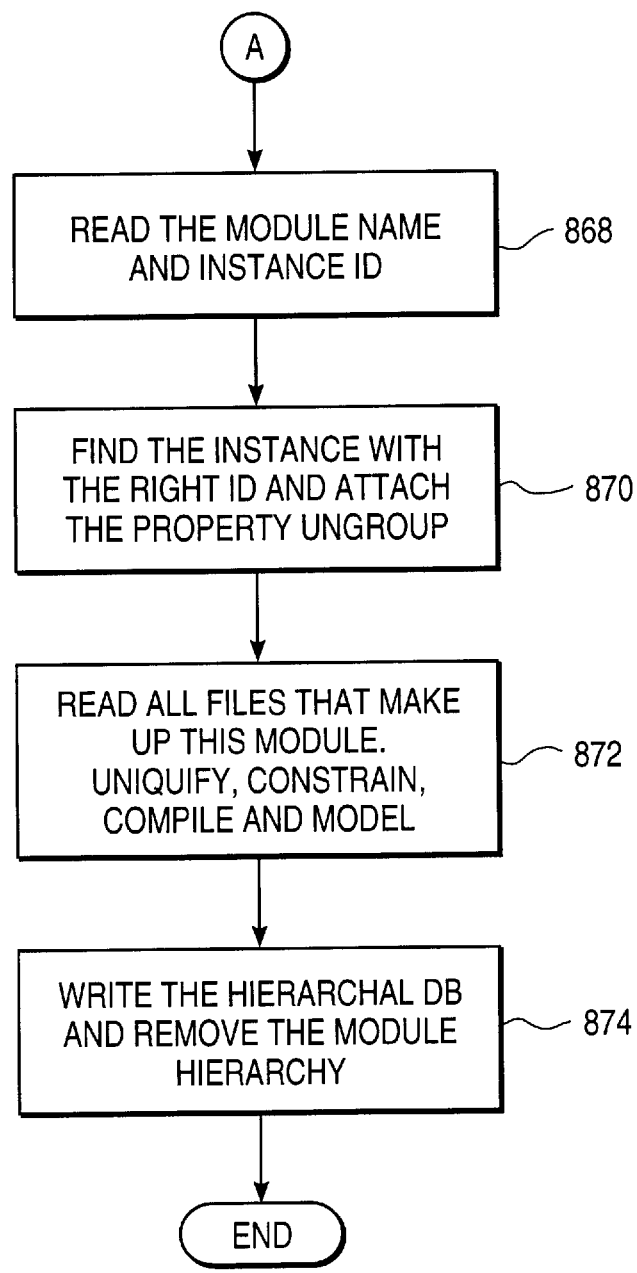
Figure 15C:
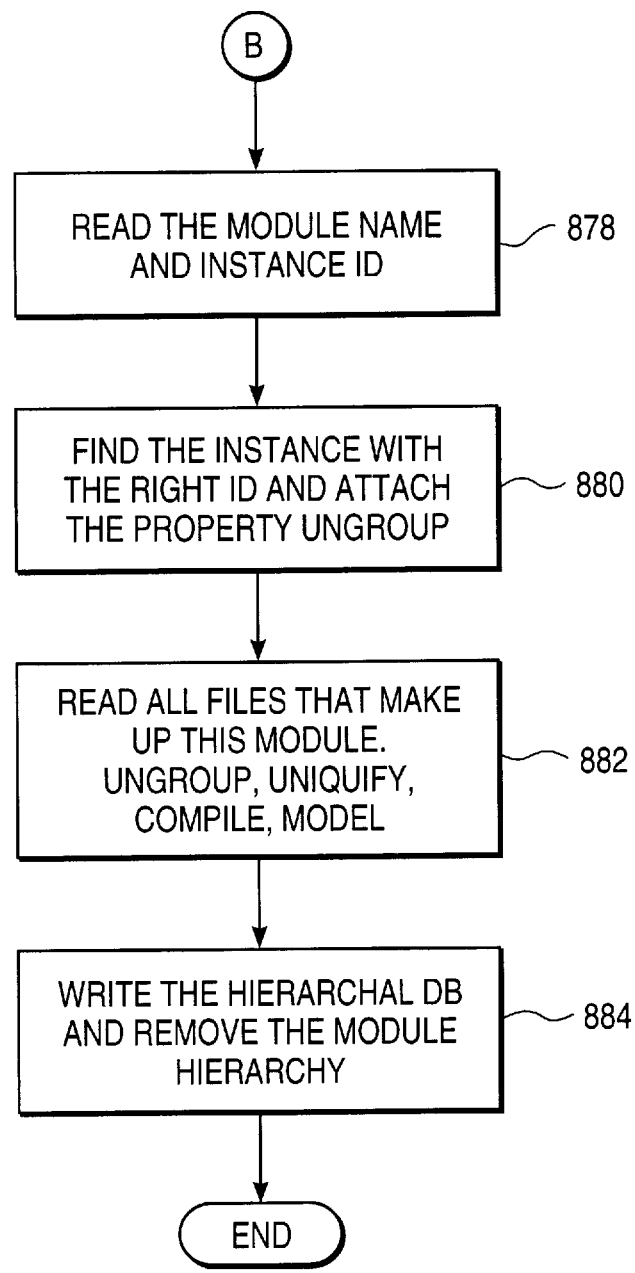

FIGS. 15A–15C show the flow of processing a recipe file during script generation. The recipe files may be utilized to modify the hierarchy of the design during synthesis. The recipe file may include a number of different commands that will affect the hierarchy as described below.

At step 850, the system reads a line from a recipe file. The system then parses the line to determine what command is included in the line at step 852. In a preferred embodiment, the commands include DONT_TOUCH, SYNLIB, UNGROUP_FLATTEN, and UNGROUP. Depending on the command, a number of different parameters may follow.

If the system determines that the command specifies DONT_TOUCH, the module name is retrieved as a parameter at step 854. DONT_TOUCH specifies that a designed HDL module should not be synthesized. For example, the module may already have gates such that it is not desirable to have the module synthesized. Nevertheless, the module is needed to see how loading and timing of the module will affect other modules.

At step 856, the system finds all instances of the specified module and adds the property DONT_TOUCH to the instances. The system then reads all the files that belong to this module and makes a MODEL in a scratch library. The design is then removed at step 858. The bottom up and top down processes during synthesis will skip over all modules marked as DONT_TOUCH so the module would be considered missing. However, the MODEL will be found during the link process in the scratch library.

If the system determines that the command specifies SYNLIB, the module name and file name are retrieved as parameters at step 860. SYNLIB specifies that a designed HDL module should not be synthesized but instead read from its own library. For example, the module may specify memories that already have a layout but don't have a netlist. The module will, nevertheless, have timing and is needed to see how it will affect other modules.

At step 862, the system finds all instances of the specified module and adds the property SYNLIB to the module instances. If this is the first time that the module has been designated SYNLIB, the system reads in the technology library specified by the file name parameter and adds it to the scratch library. The bottom up and top down processes during synthesis will skip over all modules marked as SYNLIB so the module would be considered missing. However, the MODEL will be found during the link process in the scratch library.

If the system determines that the command specifies UNGROUP, the module name and id are retrieved as parameters at step 868 of FIG. 15B. UNGROUP specifies that the hierarchy under the specified module should be compiled as a single unit, and the children should not be compiled separately. Although the module instances specified by the id are compiled as a single unit, the hierarchy is preserved. This may be done, for example, for very trivial hierarchy.

At step 870, the system finds the instance of the module with the right id and attaches the property UNGROUP. Then the system finds all files that make up the specified module the then performs uniquify, constrain, compile, and model on the module at step 872. During the bottom up process, if an encountered module instance is marked as UNGROUP, commands such as read files and uniquify are skipped and a module specific file is included in the flow. Uniquify is skipped during the bottom up process because it is done (for the Ungrouped module) prior to starting the bottom up process. This module specific file is generated when the recipe file is read.

During the top down process a module instance that has been marked as UNGROUP is characterized just like any other module instance, but its children are not characterized individually. At step 874, the system writes the hierarchical database and removes the module hierarchy.

If the system determines that the command specifies UNGROUP_FLATTEN, the module name and id are retrieved as parameters at step 878 of FIG. 15C. UNGROUP_FLATTEN specifies that the hierarchy under the specified module should be compiled as a single unit, and the children should not be compiled separately just as in UNGROUP. However, UNGROUP_FLATTEN further specifies that the hierarchy under the specified module will be flattened. Thus, the hierarchy is not preserved. This may be recommended if a module is not good for characterization.

At step 880, the system finds the instance of the module with the right id and attaches the property UNGROUP. Then the system finds all files that make up the specified module the then performs UNGROUP, uniquify, compile, and model on the module at step 882. During the bottom up process, if an encountered module instance is marked as UNGROUP, commands such as read files and uniquify are skipped and a module specific file is included in the flow. This module specific file is generated when the recipe file is read.

During the top down process a module instance that has been marked as UNGROUP is characterized just like any other module instance, but its children are not characterized individually. At step 884, the system writes the hierarchical database and removes the module hierarchy.

Figure 16:
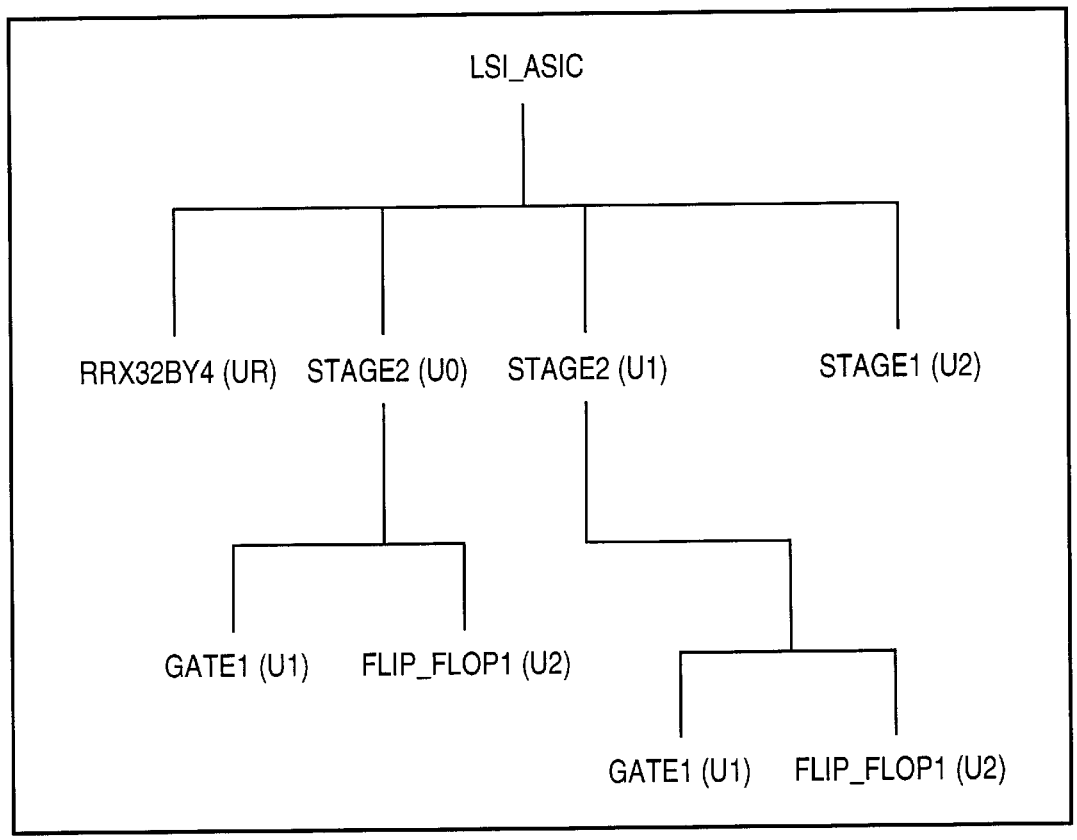
FIG. 16 shows the hierarchy of a simple ASIC design to illustrate parallel synthesis.

FIG. 16 shows the hierarchy of a simple ASIC design to illustrate parallel synthesis. The synthesis script may break up the hierarchy so that the design is synthesized in parallel in multiple processes, either running on the same or different computers.

Assume that a user wishes to synthesize blocks "stage2" and "stage1" in parallel. The user may follow the following steps:

Run the Automated Script Generator with stage2 as the top module;

Run the Automated Script Generator with stage1 as the top module;

Create an options file with the module names, directories, and on what computer the user wants the modules synthesized;

Run a parallel shell that will read the options file and start dc_shell jobs on the specified computers to do the bottom up synthesis on the specified modules. Once the jobs are submitted, the script will wait in a loop until the parallel jobs are all (two in this simple example) completed. The script will then send mail to the user as notification that the first part of the synthesis process is done, and the parallel shell will terminate;

The user then reads in the top level module and the synthesized versions of the two submodules stage2 and stage1. The user reads in the customer constraints and applies them to the top level of the design. Then the user characterizes these two submodules and writes out their database files. Although in a preferred embodiment, this step is a manual step, it may be automated in other embodiments; and Run the parallel shell again but this time the parallel shell will do the top down synthesis (e.g., specified by a command line option). The parallel shell will start two jobs on the computers specified in the options file to do the top down synthesis. The script will then wait for the jobs to complete. Once completed, the script will send mail to the user as notification that the synthesis is complete.

Design Configuration

The present invention provides a method of storing design information for an ASIC so that it may be utilized by design applications. The design information of the ASIC is stored in a database with security controls so that only certain users may change the design information. When a user requests to utilize a design application, a design configuration manager retrieves the design information from the database that is needed and formats the data into a format suitable for the application. The design information is then stored in a temporary file that may be automatically discarded after the application has run so that current information is utilized. The design configuration manager stores design information so that files can be easily generated and regenerated without having to store all the ASIC design files produced by running an application.

Figure 17:
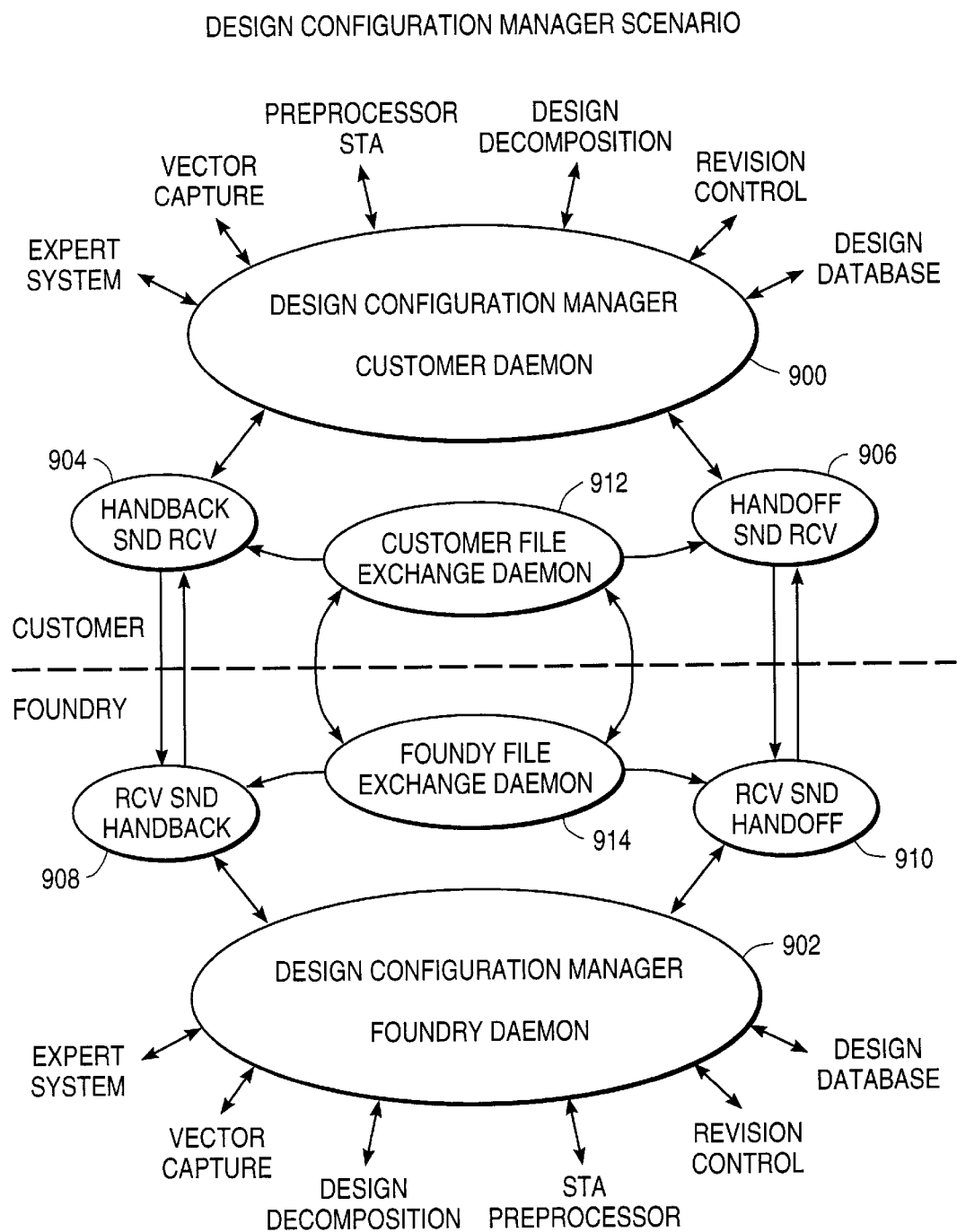
FIG. 17 shows the design configuration between the customer and foundry.

FIG. 17 shows the design configuration between the customer and foundry. A design configuration manager (daemon) 900 runs at the customer's site and a design configuration manager (daemon) 902 runs at the foundry's site. The design configuration managers maintain the design information of the customer's ASIC. The design information may include HDL source code, synthesis constraint files, clock specifications, technology, memory and test specifications, bonding diagrams, golden vectors, and timing reports. The design configuration managers maintain versions of the design information and security for modification of the design information.

The design configuration manager on the customer side interfaces with a handback routine 904 and a handoff routine 906. Similarly, the design configuration manager on the foundry side interfaces with a handback routine 908 and a handoff routine 910. The handback and handoff routines are responsible for managing the exchange of information between the customer and foundry. The handback and handoff routines maintain logs of versions for the files that are exchanged between the customer and foundry. When files are exchanged between the customer and foundry, a customer file exchange (daemon) 912 and a foundry file exchange (daemon) 914 are utilized.

The file exchangers keep track of the number of files that are to be exchanged between the customer and foundry. As the files are sent, the sending file exchanger waits for an acknowledgement that each file was received. Additionally, the receiving file exchanger may notify the sending file exchanger that file(s) are bad or otherwise corrupt so that they may be resent.

As shown in FIG. 17, the design configuration managers interface with design applications that may include the Expert System, Vector Capture program, preprocessor static timing analyzer, Design Decomposition, revision control, and design database. The design applications may be commercially available, for example, the static timing analyzer may be MOTIVE. However, other static timing analyzers may be utilized.

Figure 18:
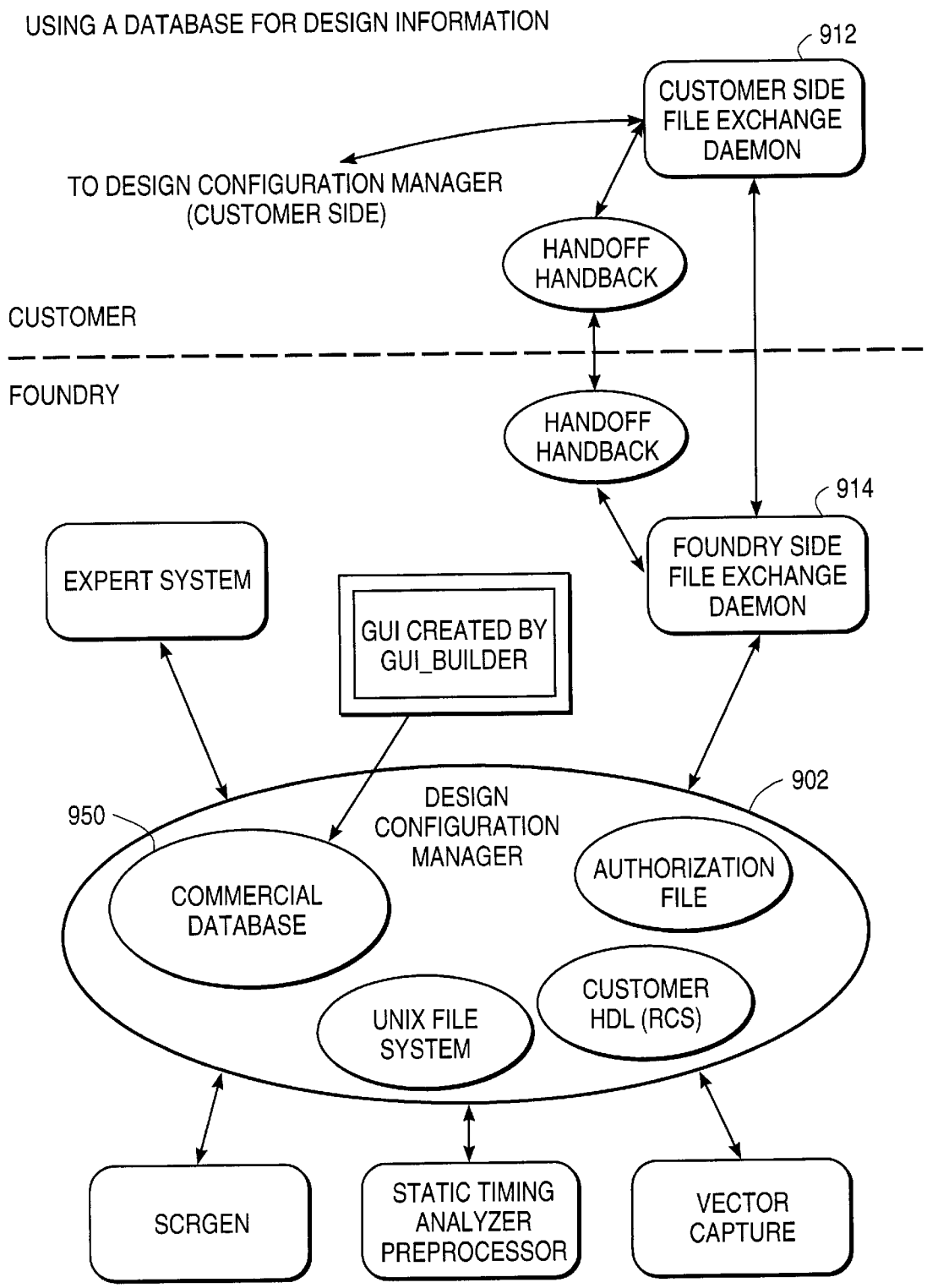
FIG. 18 shows a database utilized for storing design information.

FIG. 18 shows a database utilized for storing design information. The design configuration manager communicates with a commercial database 950 that stores the design information for the ASIC. Preferably the commercial database includes a graphical user interface (GUI) (e.g., SYBASE or Oracle). The database contains all the non-RTL design data including file relationships (family tree), synthesis constraints and false-path information, operating conditions, tool versions used, directory structure, strobe information, synthesis recipes used, design hierarchy, and other design information. Thus, the design information is stored in one location and in a single format. However, the design configuration manager can access the file system supporting the database (e.g., UNIX in a preferred embodiment) if the database is inaccessible.

When a user requests to use a design application like the Vector Capture program, the present invention formats the design information that is required for the application. For example, a temporary IOS file may need to be generated. After the Vector Capture program runs, these temporary files are deleted. This functionality of storing design information in a database and formatting the design information as required provides many advantages. Storage space is reduced as it is not necessary to store the same information in multiple formats. Additionally, the present invention is not tied to any particular application or vendor. Thus, if the synthesis tool changes, the impact is minimized as the format of the temporary files may only need to be altered.

Additionally, the database accesses an authorization file 952 which is utilized to restrict modification of the design information without the necessary security access. Thus, the authorization file ensures that only certain users can change the design information used to generate the input or files for the design applications.

Figure 19:
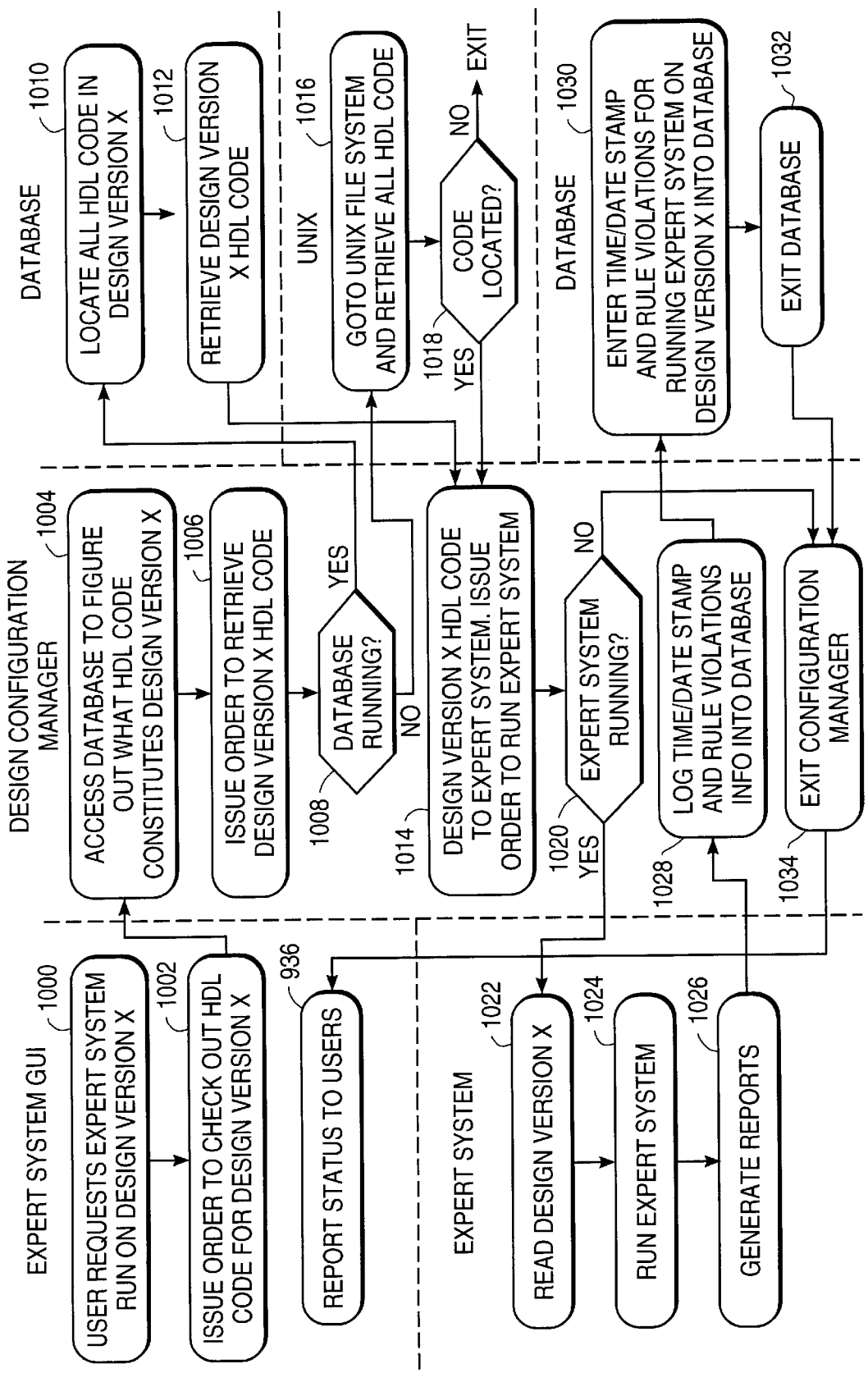
FIGS. 19 shows a flow of the process of invoking the Expert System under the design configuration.

FIGS. 19 shows a flow of the process of invoking the Expert System under the design configuration. At step 1000, the user requests to run the Expert System on design version "X." The system then issues a command to check out the HDL code for the requested design version from the design configuration manager at step 1002.

In the design configuration manager, the database is accessed to determine what HDL code constitutes the design version requested by the user at step 1004. At step 1006, a command is issued to retrieve the HDL code for the requested design version.

If the database is running at step 1008, the database locates all the HDL code that is requested at step 1010. The HDL code is then retrieved at step 1012. Once the requested HDL code for design version X is retrieved, a command is issued to run the Expert System at step 1014. If, on the other hand, the database was not running at step 1008, an attempt is made to retrieve the requested HDL code from the operating system (e.g., UNIX file system) at step 1016. If the code can be located, a command is issued to run the Expert System at step 1014.

At step 1020, it is determined whether the Expert System in running. If it is, the Expert System reads the HDL code for design version X at step 1022. The Expert System then runs at step 1024 and generates reports at step 1026. Rule violations are logged with time and date stamps into the database at step 1028. The database stores the time and date stamps of the rule violations for the design version X at step 1030. The database exits at step 1032. Subsequently, the design configuration manager exits at step 1034 and the Expert System reports the status to the user at step 1036.

Although the process of utilizing the HDL Expert System has been described, the process of other design applications will be similar. However, the program flow will be modified where appropriate for the specific application.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the metes and bounds of the appended claims along with their full scope of equivalents.

What is claimed is:

1. In a computer, a method of generating a gate level specification of an integrated circuit, comprising the steps of:

receiving as input user-specified constraints and a programming language description of the integrated circuit;

generating at least one synthesis script for the integrated circuit that specifies the following steps:
  (i) synthesizing lower level modules according to default constraints;
  (ii) synthesizing a top level module according to the user-specified constraints; and
  (iii) thereafter characterizing the synthesized lower level modules according to the user-specified constraints; and generating the gate level specification of the integrated circuit with the at least one synthesis script as input.

2. The method of claim 1, further comprising the step of receiving input that changes a hierarchy of the programming language description of the integrated circuit in the at least one synthesis script.

3. The method of claim 1, wherein the at least one synthesis script specifies that a plurality of processes generate the gate level specification of the integrated circuit.

4. The method of claim 1, further comprising the step of receiving a design specific synthesis recipe for changing hierarchy of the integrated circuit.

5. The method of claim 1, further comprising the step of receiving a design specific synthesis recipe specifying areas of the integrated circuit that should not be altered during generation of the gate level specification of the integrated circuit.

6. The method of claim 1, wherein at least two synthesis scripts are generated and executed on different processors including the following steps:
  parallelizing execution of synthesis scripts according to hierarchy level; and
  merging parallel synthesis scripts into another hierarchy level.

7. The method of claim 6, further comprising the step of merging parallel synthesis scripts into another level until the top level is reached.

8. The method of claim 1, further comprising the step of generating a timing representation.

9. The method of claim 1, wherein the user-specified characteristics include design constraints, clock characteristics, technology information.

10. A computer comprising:
  means for receiving as input user-specified constraints and a programming language description of an integrated circuit;
  means for generating at least one synthesis script for the integrated circuit that specifies the following:
    (i) means for synthesizing lower level modules according to default constraints;
    (ii) means for synthesizing a top level module according to the user-specified constraints; and
    (iii) means for thereafter characterizing the synthesized lower level modules according to the user-specified constraints; and
  means for generating a gate level specification of the integrated circuit with the at least one synthesis script as input.

11. A computer program product that generates at least one synthesis script for an integrated circuit, comprising:
  code that receives as input user-specified constraints and a programming language description of the integrated circuit;
  code that generates the at least one synthesis script for the integrated circuit;
  code that generates the at least one synthesis script for the integrated circuit that specifies the following steps:
    (i) synthesizing lower level modules according to default constraints;
    (ii) synthesizing a top level module according to the user-specified constraints; and
    (iii) thereafter characterizing the synthesized lower level modules according to the user-specified constraints; and
  a computer readable medium that stores the codes.

* * * * *